US011749492B2

United States Patent
Liu et al.

(10) Patent No.: US 11,749,492 B2
(45) Date of Patent: Sep. 5, 2023

(54) MECHANICALLY-STABLE ELECTRON SOURCE

(71) Applicant: FEI Company, Hillsboro, OR (US)

(72) Inventors: Kun Liu, Portland, OR (US); Gregory A. Schwind, Portland, OR (US); Alan S. Bahm, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 17/654,759

(22) Filed: Mar. 14, 2022

(65) Prior Publication Data

US 2022/0293387 A1 Sep. 15, 2022

Related U.S. Application Data

(60) Provisional application No. 63/160,207, filed on Mar. 12, 2021.

(51) Int. Cl.
*H01J 37/073* (2006.01)
*H01J 9/02* (2006.01)

(52) U.S. Cl.
CPC .......... *H01J 37/073* (2013.01); *H01J 9/025* (2013.01); *H01J 2237/06341* (2013.01)

(58) Field of Classification Search
CPC ........ H01J 37/073; H01J 37/065; H01J 37/08; H01J 2237/002; H01J 2237/06341; H01J 2237/06316; H01J 27/024; H01J 27/26
See application file for complete search history.

(56) References Cited

U.S. PATENT DOCUMENTS

| 5,616,926 A | 4/1997 | Shinada et al. |
| 6,680,562 B1 | 1/2004 | McGinn et al. |
| 7,064,477 B2 | 6/2006 | Magera et al. |

(Continued)

FOREIGN PATENT DOCUMENTS

| EP | 2175472 A1 | 4/2010 |
| JP | H0737484 A | 2/1995 |

(Continued)

OTHER PUBLICATIONS

Extended European Search Report from European Application No. 22161243.5, dated Jul. 21, 2022, 14 pages.

*Primary Examiner* — David E Smith
*Assistant Examiner* — Hsien C Tsai
(74) *Attorney, Agent, or Firm* — Klarquist Sparkman, LLP

(57) ABSTRACT

An electron source has an insulating base, a pair of conductive terminals, an insulating support member, a drift isolation member, an emitter-cathode, and one or more heating elements. The conductive terminals are exposed from a first surface of the insulating base. The insulating support member extends from the first surface of the insulating base. The drift isolation member is disposed at an end of the insulating support member remote from the insulating base. The emitter-cathode is coupled to the drift isolation member. The one or more heating elements are coupled to the conductive terminals and the drift isolation member. The combination of the drift isolation member with the insulating support member can prevent stress-induced drift from impacting position of the emitter-cathode, thereby improving the mechanical stability of the electron source.

26 Claims, 11 Drawing Sheets

(56) References Cited

U.S. PATENT DOCUMENTS

| | | | |
|---|---|---|---|
| 7,969,080 B2 * | 6/2011 | Terui | ............... B82Y 40/00 313/310 |
| 8,040,034 B2 | 10/2011 | Nonogaki et al. | |
| 8,736,170 B1 | 5/2014 | Liu et al. | |
| 8,896,195 B2 | 11/2014 | Dou | |
| 2015/0357147 A1 * | 12/2015 | Yasaka | ............... H01J 3/04 313/35 |

FOREIGN PATENT DOCUMENTS

| | | | | |
|---|---|---|---|---|
| WO | 2019118489 A1 | 6/2019 | | |
| WO | WO-2019118489 A1 * | 6/2019 | ............. | H01J 1/304 |

* cited by examiner

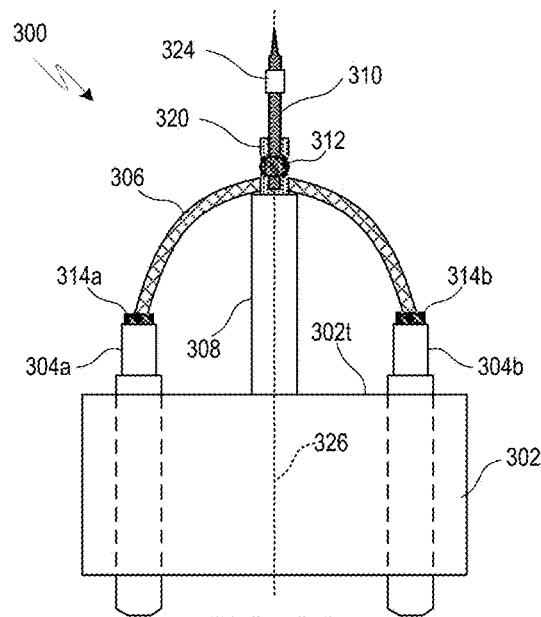
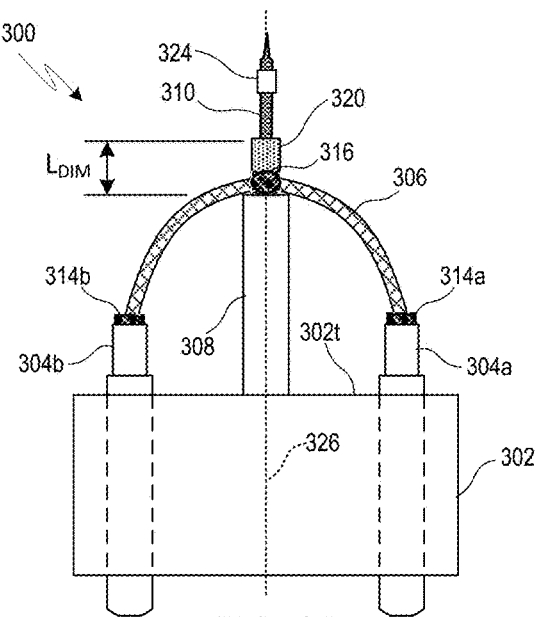
FIG. 3A          FIG. 3B
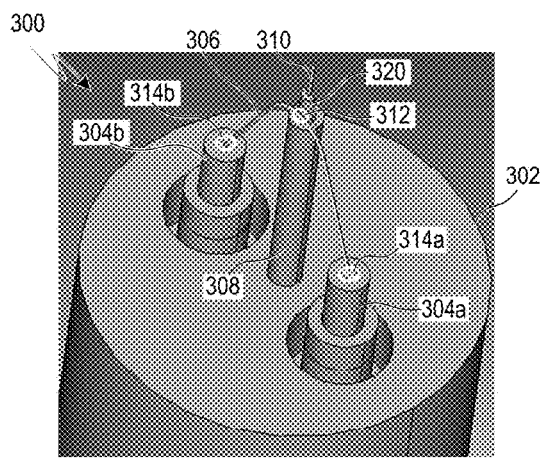
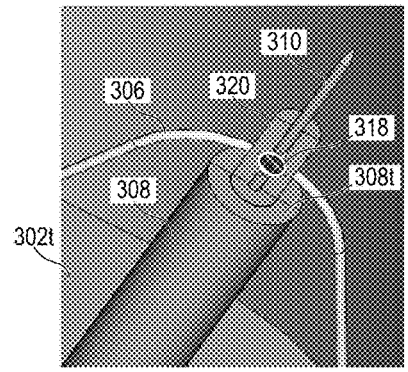
FIG. 3C          FIG. 3D
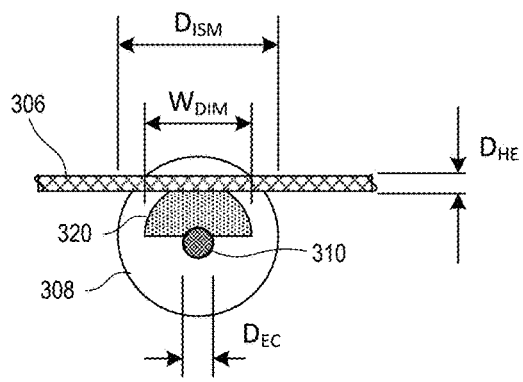
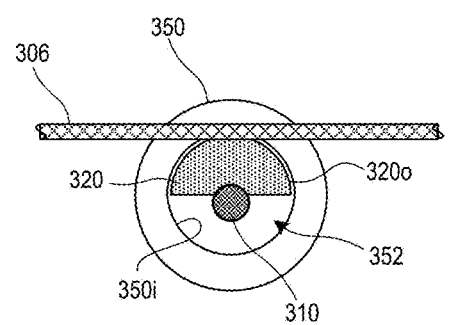
FIG. 3E          FIG. 3F

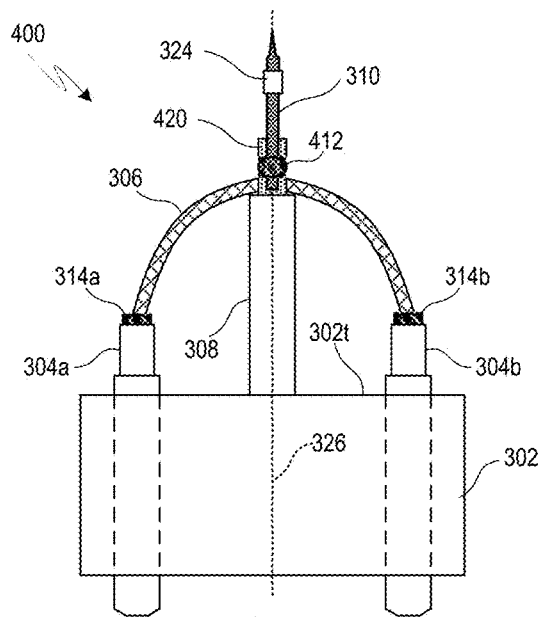
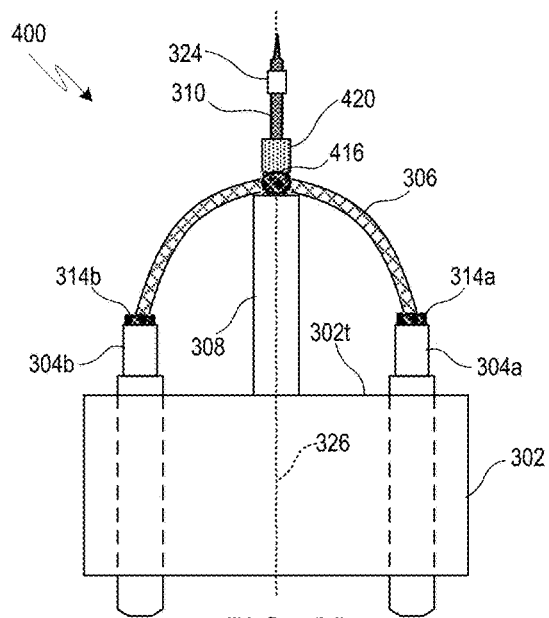
FIG. 4A　　　　　FIG. 4B
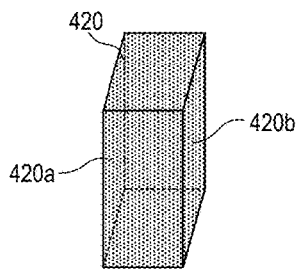
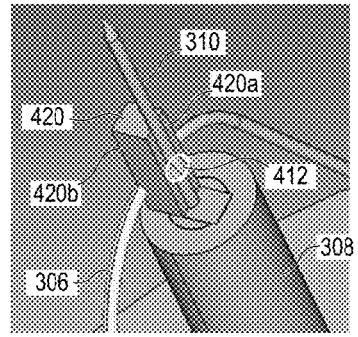
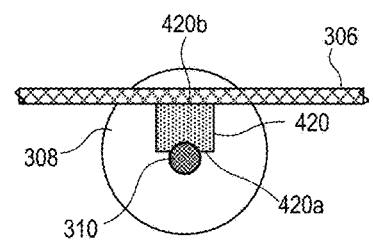
FIG. 4C　　　FIG. 4D　　　FIG. 4E
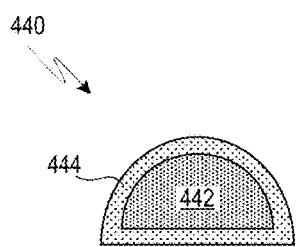
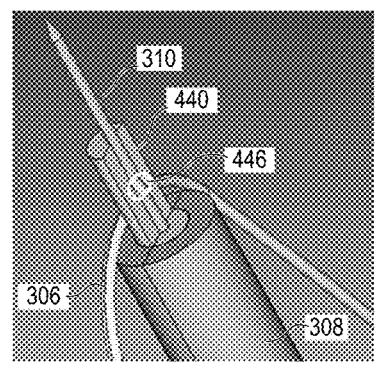
FIG. 4F　　　　　FIG. 4G

MECHANICALLY-STABLE ELECTRON SOURCE

CROSS REFERENCE TO RELATED APPLICATION

This application claims the benefit of U.S. Provisional Patent Application No. 63/160,207, filed on Mar. 12, 2021, which is incorporated herein by reference in its entirety.

FIELD

The present disclosure relates generally to electron guns or sources, and, more particularly, to field emission guns (FEG) or sources with enhanced mechanical stability for use in, for example, electron microscopes.

SUMMARY

Embodiments of the disclosed subject matter provide electron sources with enhanced mechanical stability and methods for manufacturing thereof. In conventional electron sources, a heating element is spot welded at opposite ends to conductive terminals in an insulating base and at a middle region directly to an emitter-cathode. Any mechanical stresses stored within the heating elements or corresponding spot welds are transmitted to the emitter-cathode and thus result in drift in the emitter-cathode position over time. In some embodiments, the emitter-cathode and the heating element are instead indirectly coupled together via an intervening drift isolation member, which is rigidly attached to the insulating base by an insulating support member. Alternatively, in some embodiments, the emitter-cathode is rigidly attached to the insulating base by the insulating support member, and the heating element is directly coupled to the emitter-cathode near a junction between the emitter-cathode and the insulating support member. As a result, changes in emitter-cathode position from stress-induced mechanical drift can be avoided or at least reduced, thereby resulting in an electron source that is more mechanically-stable over time.

In one or more embodiments, an electron source can comprise an insulating base, a pair of conductive terminals, an insulating support member, a drift isolation member, an emitter-cathode, and one or more heating elements. The pair of conductive terminals can be exposed from a first surface of the insulating base. The insulating support member can extend from the first surface of the insulating base. The drift isolation member can be disposed at an end of the insulating support member remote from the insulating base. The emitter-cathode can be coupled to the drift isolation member. The one or more heating elements can be coupled to the conductive terminals and the drift isolation member.

In one or more embodiments, an electron source can comprise an insulating base, a pair of conductive terminals, an insulating support member, an emitter-cathode, and one or more heating elements. The pair of conductive terminals can be exposed from a first surface of the insulating base. The insulating support member can extend from the first surface of the insulating base. The emitter-cathode can be coupled to the insulating support member. The one or more heating elements can extend between and be coupled to the conductive terminals and the emitter-cathode. The one or more heating elements can be coupled to the emitter-cathode at one or more respective first locations that are substantially adjacent to a junction between the emitter-cathode and the insulating support member.

In one or more embodiments, an electron source can comprise an insulating base, a pair of conductive terminals, an emitter-cathode, one or more heating elements coupled to at least the conductive terminals, and means for isolating the emitter-cathode from mechanical drift.

In one or more embodiments, a method of manufacturing an electron source can comprise coupling an insulating support member to an insulating base having a plurality of conductive terminals. The method can also comprise coupling a drift isolation member to the insulating support member. The method can further comprise coupling an emitter to the drift isolation member. The method can also comprise coupling one or more heating elements to conductive terminals. The method can further comprise coupling the one or more heating elements to the drift isolation member. The method can also comprise forming an emitter tip at an end of the emitter to form an emitter-cathode.

In one or more embodiments, a method of manufacturing an electron source can comprise coupling an insulating support member to an insulating base having a plurality of conducive terminals. The method can also comprise coupling an emitter to the insulating support member. The method can further comprise coupling one or more heating elements to conductive terminals. The method can also comprise coupling the one or more heating elements to the emitter at one or more first locations that are substantially adjacent to a junction between the emitter and the insulating support member. The method can further comprise forming an emitter tip at an end of the emitter to form an emitter-cathode.

Any of the various innovations of this disclosure can be used in combination or separately. This summary is provided to introduce a selection of concepts in a simplified form that are further described below in the detailed description. This summary is not intended to identify key features or essential features of the claimed subject matter, nor is it intended to be used to limit the scope of the claimed subject matter. The foregoing and other objects, features, and advantages of the disclosed technology will become more apparent from the following detailed description, which proceeds with reference to the accompanying figures.

BRIEF DESCRIPTION OF THE DRAWINGS

The following description will proceed with reference to the accompanying drawings, which have not necessarily been drawn to scale. Where applicable, some elements may be simplified or otherwise not illustrated in order to assist in the illustration and description of underlying features. Throughout the drawings, like reference numerals denote like elements.

FIGS. 3A-3B are front and back elevation views, respectively, of a first exemplary electron source, according to one or more embodiments of the disclosed subject matter.

FIGS. 3C-D are detailed perspective views of the first exemplary electron source of FIGS. 3A-3B.

FIG. 3E is a simplified plan view illustrating the positional relationship between the heating element, drift isolation member, insulating support member, and emitter-cathode in the first exemplary electron source of FIGS. 3A-3D.

FIG. 3F is a simplified plan view illustrating the positional relationship between the heating element, drift isolation member, insulating support member, and emitter-cathode in a variation of the first exemplary electron source.

FIGS. 4A-4B are front and back elevation views, respectively, of a second exemplary electron source, according to one or more embodiments of the disclosed subject matter.

FIG. 4C is a simplified perspective view of the drift isolation member employed in the second exemplary electron source of FIGS. 4A-4B.

FIG. 4D is a detailed perspective view of the second exemplary electron source of FIGS. 4A-4B.

FIG. 4E is a simplified plan view illustrating the positional relationship between the heating element, drift isolation member, insulating support member, and emitter-cathode in the second exemplary electron source.

FIG. 4F is a simplified cross-sectional view of a variation of a drift isolation member that can be employed in either of the first and second exemplary electron sources.

FIG. 4G is a detailed perspective view illustrating an electron source with the drift isolation member of FIG. 4F.

DETAILED DESCRIPTION

General Considerations

Figure 1A:
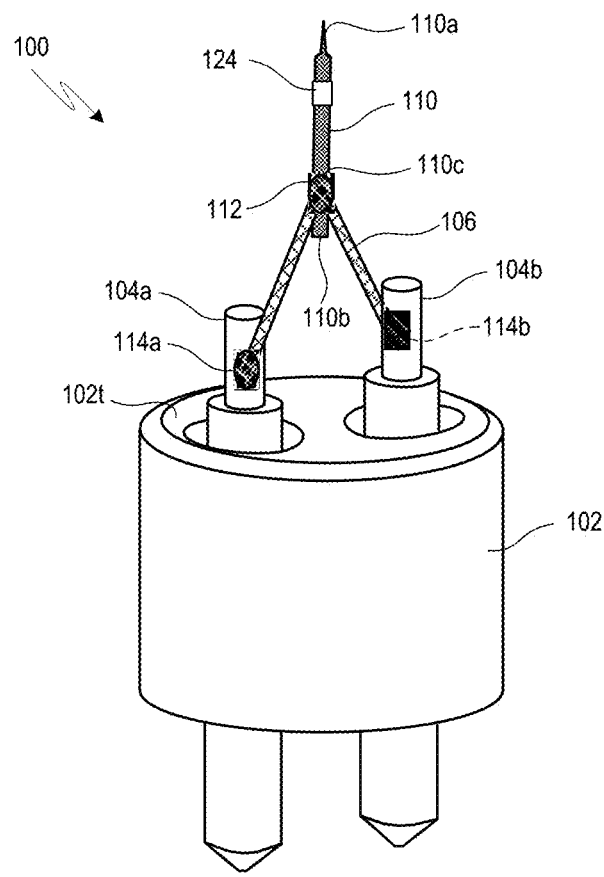
FIGS. 1A-1B are perspective and top-down plan views, respectively, of an electron source with heating element directly coupled to the emitter-cathode.

For purposes of this description, certain aspects, advantages, and novel features of the embodiments of this disclosure are described herein. The disclosed methods and systems should not be construed as being limiting in any way. Instead, the present disclosure is directed toward all novel and nonobvious features and aspects of the various disclosed embodiments, alone and in various combinations and sub-combinations with one another. The methods and systems are not limited to any specific aspect or feature or combination thereof, nor do the disclosed embodiments require that any one or more specific advantages be present, or problems be solved. The technologies from any embodiment or example can be combined with the technologies described in any one or more of the other embodiments or examples. In view of the many possible embodiments to which the principles of the disclosed technology may be applied, it should be recognized that the illustrated embodiments are exemplary only and should not be taken as limiting the scope of the disclosed technology.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "provide" or "achieve" to describe the disclosed methods. These terms are high-level abstractions of the actual operations that are performed. The actual operations that correspond to these terms may vary depending on the particular implementation and are readily discernible by one of ordinary skill in the art.

The disclosure of numerical ranges should be understood as referring to each discrete point within the range, inclusive of endpoints, unless otherwise noted. Unless otherwise indicated, all numbers expressing quantities of components, molecular weights, percentages, temperatures, times, and so forth, as used in the specification or claims are to be understood as being modified by the term "about." Accordingly, unless otherwise implicitly or explicitly indicated, or unless the context is properly understood by a person of ordinary skill in the art to have a more definitive construction, the numerical parameters set forth are approximations that may depend on the desired properties sought and/or limits of detection under standard test conditions/methods, as known to those of ordinary skill in the art. When directly and explicitly distinguishing embodiments from discussed prior art, the embodiment numbers are not approximates unless the word "about" is recited. Whenever "substantially," "approximately," "about," or similar language is explicitly used in combination with a specific value, variations up to and including 10% of that value are intended, unless explicitly stated otherwise.

Directions and other relative references may be used to facilitate discussion of the drawings and principles herein, but are not intended to be limiting. For example, certain terms may be used such as "inside," "outside,", "top," "bottom," "interior," "exterior," "left," right," "front," "back," "rear," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" part can become a "lower" part simply by turning the object over. Nevertheless, it is still the same part and the object remains the same.

As used herein, "comprising" means "including," and the singular forms "a" or "an" or "the" include plural references unless the context clearly dictates otherwise. The term "or" refers to a single element of stated alternative elements or a combination of two or more elements, unless the context clearly indicates otherwise.

Although there are alternatives for various components, parameters, operating conditions, etc. set forth herein, that does not mean that those alternatives are necessarily equivalent and/or perform equally well. Nor does it mean that the alternatives are listed in a preferred order, unless stated otherwise. Unless stated otherwise, any of the groups defined below can be substituted or unsubstituted.

Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the appended claims.

Introduction

Figure 1B:
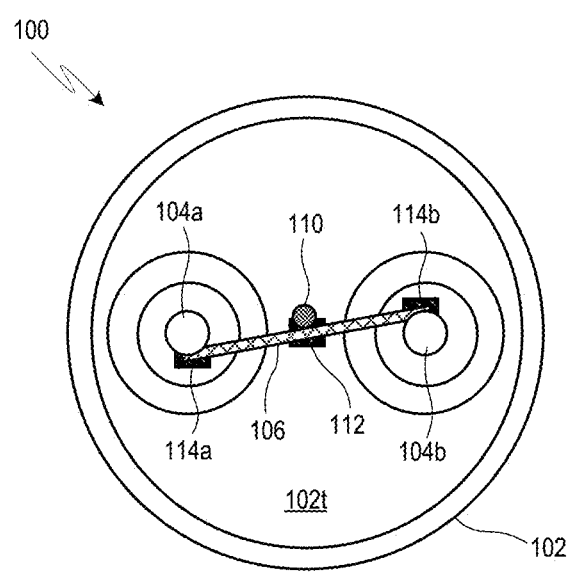

Electron microscopes use a beam of electrons to image or analyze an object. To generate the beam of electrons, the microscope employ an electron source, such as a field emission gun (FEG), which employ a sharply-pointed Müller-type emitter (e.g., emitter-cathode) held at a negative potential (e.g., several kilovolts) in order to cause field electron emission. Such emitter-cathodes can be either of the cold-cathode type (e.g., cold-field (CF) emitter), Schottky type (e.g., coated to form a reservoir to decrease a work function for thermionic emission), or thermal-field type (e.g., thermal field emitter (TFE)). For example, FIGS. 1A-1B illustrate an example of a Schottky-type electron source 100 that can be employed in electron microscopes. The electron source 100 includes an insulating base 102 (e.g., ceramic) with a pair of conductive terminals 104a, 104b (also referred to herein as posts) exposed from a top surface 102t of the base 102. A heating element 106 (also referred to herein as heating filament) extends between the terminals 104a, 104b and is coupled thereto via respective spot welds 114a, 114b. An emitter-cathode 110 is coupled to a mid-region of the heating element 106 via a spot weld 112. The emitter-cathode 110 has a sharply-pointed tip 110a at an opposite end of the emitter-cathode 110 from a base end 110b (also referred to herein as tail end). Between the base end 110b and the tip 110a, the emitter-cathode 110 has a body region 110c of substantially constant diameter.

In the illustrated example, the emitter-cathode 110 includes a reservoir 124 coated on the body region 110c proximal to the tip 110a. However, when the emitter-cathode is constructed as a TFE or CF emitter, the reservoir 124 can be omitted. In addition, in the illustrated example, the spot weld 112 is provided proximal to the base end 110b. However, the spot weld 112 can be disposed elsewhere along the body region 110c between the reservoir 124 and the base end 110b. Other mechanisms for coupling (e.g., brazing, etc.) are also possible in place of or in addition to spot welding.

However, it has been found that electron source 100 suffers from mechanical instability over time. In particular, as the source 100 is operated, the position of the emitter-cathode 110 tends to drift over time, with the positional changes being greatest in the period immediately after initial installation of the emitter source. Thus, while the electron beam generated by the emission source 100 may initially be aligned with the optical axis of the microscope, soon after installation the electron beam will become misaligned (e.g., off-axis) due to the emitter mechanical drift, thereby requiring re-alignment by an operator or technician. As the emitter-cathode 110 continues to drift during operation, additional service operations may be necessary to realign the electron source 100 to compensate for such ongoing positional changes.

Based on investigation of the electron source 100 of FIGS. 1A-1B, the present inventors have discovered that mechanical stresses introduced during the manufacturing process are stored in the heating element 106 and corresponding spot welds 112, 114a, and 114b. During operation of the electron source 100 in an electron microscope, the stored stresses are gradually released, thus moving the emitter-cathode 110 away from its initial aligned position.

Disclosed herein are electron sources with enhanced mechanical stability, which can avoid, or at least reduce, stress-induced positional drift of the emitter-cathode over time. In some embodiments, the electron source employs an isolation structure that provides mechanical support to the emitter-cathode rather than relying solely on the heating element to provide such support. The functions of thermal heating and structural support can thus be separated and optimized independently. In addition, in some embodiments, the construction of the heating element (e.g., material composition, dimensions, etc.) is altered to further reduce the effect of any stored stresses on the emitter-cathode position. Accordingly, after initial alignment when installed in an electron microscope, electron sources according to embodiments of the disclosed subject matter can remain substantially aligned with the microscope's optical axis over time, without otherwise requiring re-alignment or at least requiring fewer or less frequent alignment interventions.

Figure 2A:
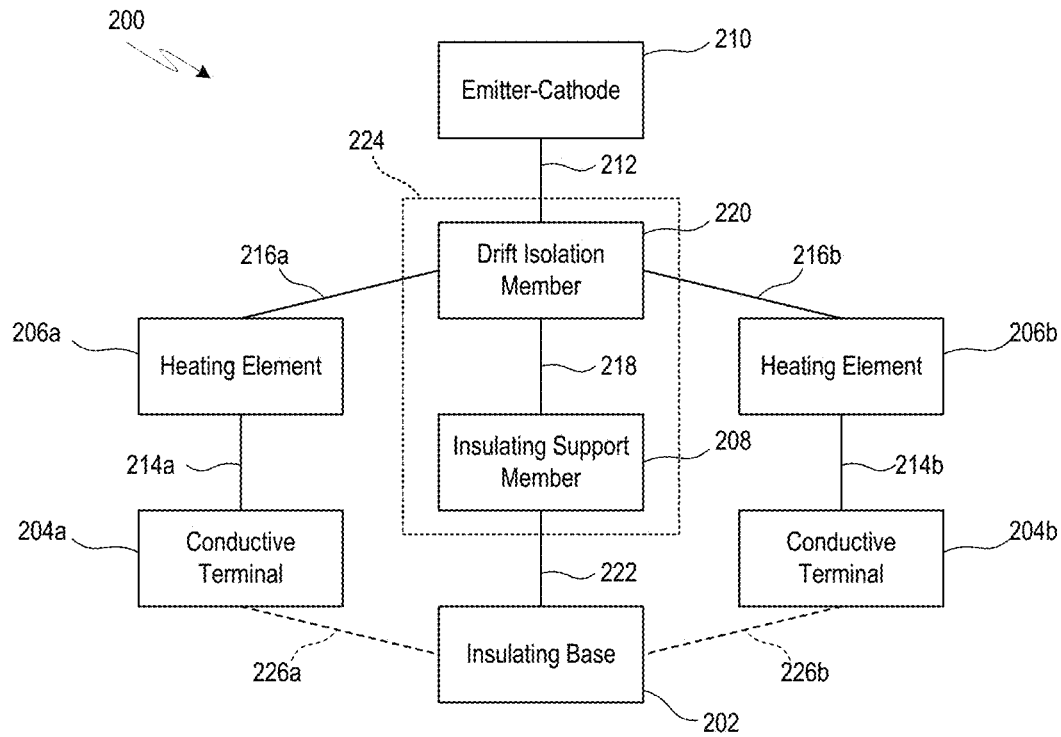
FIG. 2A is a simplified schematic diagram illustrating certain aspects of a mechanically-stable electron source, where the emitter-cathode and heating element are indirectly coupled together by an intervening drift isolation member, according to one or more embodiments of the disclosed subject matter.

For example, FIG. 2A illustrates certain aspects of a mechanically-stable electron source 200, according to one or more embodiments of the disclosed subject matter. The electron source 200 includes an emitter-cathode 210, an insulating base 202, and a pair of conductive terminals 204a, 204b (e.g., a metal), which may be supported by or coupled to the insulating base 202, for example, via respective couplings 226a, 226b (e.g., brazed or soldered joint). When configured as a Schottky-type emitter, the emitter-cathode 210 can have a coating forming a reservoir. For example, a Schottky-type emitter-cathode can be formed of tungsten (W) (and/or alloys thereof) with a zirconium oxide ($ZrO_2$) reservoir. Alternatively, when configured as a TFE or CF emitter, the emitter-cathode 210 can be formed without any coating or reservoir. For example, a TFE or CF emitter-cathode can be formed of single-crystal tungsten (W).

The electron source 200 further includes one or more heating elements. In the example of FIG. 2A, two heating elements 206a, 206b are respectively coupled to conductive terminals 204a, 204b, for example, via respective couplings 214a, 214b (e.g., spot weld). However, it should be appreciated that a single heating element could instead be provided, with the heating element being coupled at opposite ends to the respective conductive terminals 204a, 204b via couplings 214a, 214b.

The electron source 200 further includes an insulating support member 208, which may be supported by or coupled to the insulating base 202, for example, via coupling 222 (e.g., sintered joint). The insulating support member 208 and the insulating base 202 can each be formed of one or more ceramic materials, which may be the same for both or different. In general, the ceramic material is selected to have a relatively low thermal conductivity at the elevated temperatures generated during operation of the electron source 200. For example, the ceramic material can have a thermal conductivity less than or equal to 10.0 W/m-K at temperatures in excess of 1000° C. For example, in some embodiments, the insulating support member 208, the insulating base 202, or both are formed of aluminum oxide ($Al_2O_3$) or mullite ($3Al_2O_3.2SiO_2$ or $2Al_2O_3.SiO_2$). Other types of ceramic materials for the insulating support member 208, the insulating base 202, or both are also possible according to one or more contemplated embodiments.

The electron source 200 also includes a drift isolation member 220 (e.g., metal or having a metal surface) supported by or coupled to the insulating support member 208, for example, via coupling 218 (e.g., brazed or soldered joint). The emitter-cathode 210 of the electron source 200 can be supported by or coupled to the drift isolation member 220, for example, via coupling 212 (e.g., spot weld). The heating elements 206a, 206b are also coupled to the drift isolation member 220, for example, via respective couplings 216a, 216b (e.g., spot weld). The emitter-cathode 210 and the heating elements 206a, 206b are thus indirectly coupled to each other via the intervening drift isolation member 220. The insulating support member 208 rigidly connects the drift isolation member 220 to the insulating base 202, thereby providing support to the emitter-cathode 210. The combination of the drift isolation member 220 and insulating support member 208, as well as the respective couplings thereto, act to isolate the emitter-cathode 210 from any stress-induced displacement (e.g., thermal expansion stress, residual spot-welding induced stress, etc.) and may thus be considered mechanical drift isolation means 224.

In general, the drift isolation member 220 can have a size larger than the heating element(s) 206a, 206b, the emitter-cathode 210, or both, but still small enough to avoid negative impacts to source thermal management due to heat sinking. For example, the drift isolation member 220 can have a maximum lateral dimension in a plane perpendicular to a direction of extension of the emitter-cathode that is at least two times greater (e.g., three times or greater) than a maximum diameter of the emitter-cathode. For example, when the drift isolation member 220 is constructed as a cylinder or half-cylinder, the maximum lateral dimension comprises a diameter thereof. Accordingly, when the emitter-cathode 210 has a diameter of 50 μm to 500 μm, the drift isolation member 220 would have a diameter of at least 100 μm to 1 mm. Other exemplary shapes for the drift isolation member 220 are also possible, and certain non-limiting examples are discussed in further detail below.

Moreover, in some embodiments, the drift isolation member 220 can be formed of a material that is stiffer (e.g., modulus of elasticity greater than) than that of the heating elements 206a, 206b. For example, in some embodiments, the material forming the drift isolation member 220 has a modulus of elasticity greater than or equal to 400 GPa, while the material forming the heating elements 206a, 206b has a modulus of elasticity less than or equal to 400 GPa, for example, less than or equal to 200 GPa. The stiffer material of the drift isolation member 220, as compared to the softer material of the heating elements 206a, 206b, can further isolate positional changes to the heating elements rather than impacting the emitter-cathode 210.

In some embodiments, the flexibility of the heating elements 206a, 206b can be further increased by altering its size and/or geometry. For example, the heating elements 206a, 206b can have a diameter (or a maximum cross-sectional dimension for a non-circular cross-section) that is less than or equal to 10 mil (e.g., 250 μm). In some embodiments, the heating elements 206a, 206b can have a diameter that is less than or equal to 5 mil (e.g., 127 μm), for example, 3 mil (e.g., 76 μm). In some embodiments, the heating elements 206a, 206b have a variable cross-sectional profile along their lengths, for example, to increase flexibility of the heating element at locations remote from the emitter-cathode 210. For example, the diameter of the heating element where it is welded to the conductive terminal can be reduced (e.g., by electrochemical etching, grinding, etc.) as compared to the diameter of the heating element where it is welded to the drift isolation member.

In general, the materials of the electron source 200 should also be selected to withstand the elevated temperatures generated during operation of the electron source 200, for example, by having a melting temperature substantially higher than 1800-2000 K. For example, the conductive terminals can be formed of molybdenum (Mo), which has a melting temperature of about 2896 K. In some embodiments, the material forming the heating elements 206a, 206b can be selected to have a relatively high electrical resistivity, in order to reduce the current required to achieve the desired operating temperature (e.g., 1800 K). For example, the heating element material can have an electrical resistivity of at least 50 nΩ·m. In some embodiments, the electrical resistivity of the heating element can be at least 100 nΩ·m. In certain embodiments, for example, the drift isolation member 220 is formed of rhenium (Re), which has a modulus of elasticity of about 461 GPa and a melting temperature of about 3458 K. In certain embodiments, for example, the heating elements 206a, 206b are formed of tantalum (Ta), which has a modulus of elasticity of about 186 GPa, a melting temperature of about 3290 K, and an electrical resistivity of about 131 nΩ·m (at 20° C.).

Figure 2B:
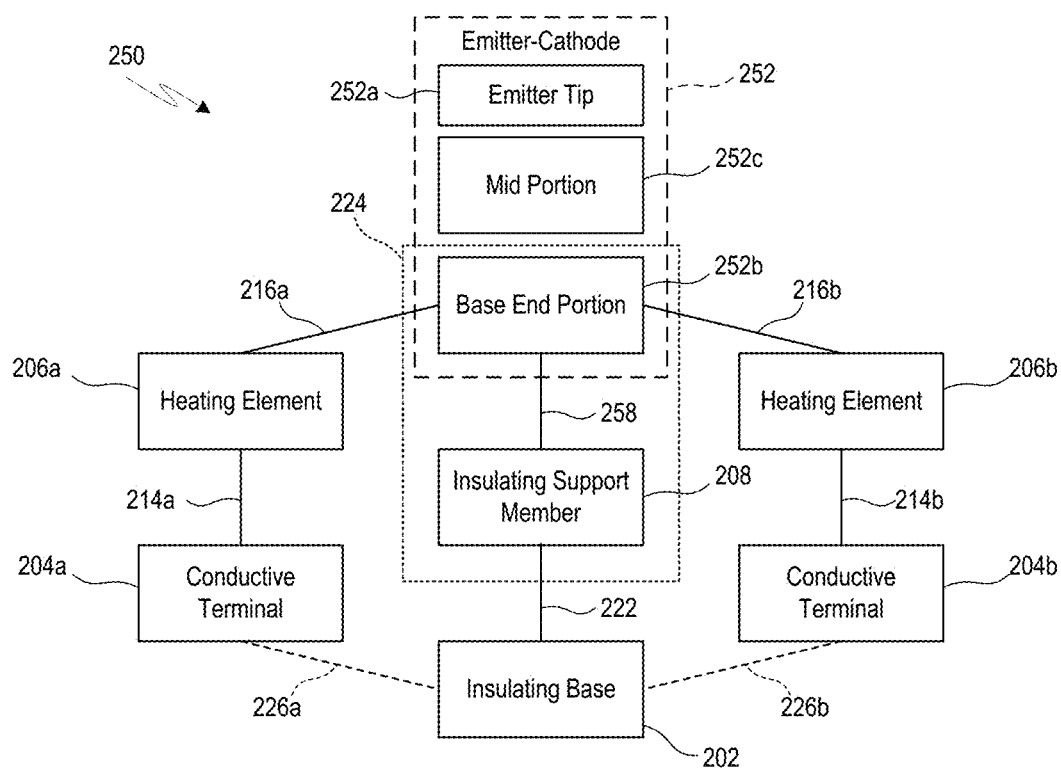
FIG. 2B is a simplified schematic diagram illustrating certain aspects of another mechanically-stable electron source, where the emitter-cathode is directly coupled to the heating element, according to one or more embodiments of the disclosed subject matter.

Alternatively, in some embodiments, the emitter-cathode can be rigidly attached to the insulating base by the insulating support member, and the heating element can be directly coupled to the emitter-cathode. For example, FIG. 2B illustrates certain aspects of such a mechanically-stable electron source 250. Similar to FIG. 2A, the electron source 250 includes an insulating base 202, conductive terminals 204a, 204b, heating elements 206a, 206b (or a single heating element), and an insulating support member 208. The details of such components and couplings therebetween are the same as those described above for electron source 200 of FIG. 2A and will not be repeated here. When configured as a Schottky-type emitter, the emitter-cathode 252 can have a coating forming a reservoir, for example, along middle portion 252c proximal to the emitter tip 252a. Alternatively, when configured as a TFE or CF emitter, the emitter-cathode 252 can be formed without any coating or reservoir.

However, in contrast to FIG. 2A, the electron source 250 has emitter-cathode 252 supported by or directly coupled to the insulating support member 208, for example, via coupling 258 (e.g., brazed or soldered joint). In the illustrated example, a base end portion 252b of the emitter-cathode 252 is coupled to the insulating support member 208 (e.g., a top surface thereof). The emitter-cathode 252 thus extends axially away from the insulating support member 208, with an emitter tip 252a thereof remote from the insulating support member 208, and an intermediate middle portion 252c (or body portion) separating the emitter tip 252a from the base end portion 252b (or tail end).

Further in contrast to FIG. 2A, the heating elements 206a, 206b are directly coupled to the emitter-cathode 252 at the base end portion 252b, for example, via respective couplings 216a, 216b (e.g., spot welds) disposed near a junction between the emitter-cathode 252 and the insulating support member 208. As used here, "near" refers to the portion of the heating element welded to the emitter-cathode being spaced from the junction between the emitter-cathode and the insulating support member by no more three times the diameter of the heating element (e.g., less than 381 μm for a 127 μm diameter heating element). Since the heating elements 206a, 206b are attached near the rigid junction rather than within middle portion 252c, any positional variations introduced by the heating elements (e.g., due to stored stress or thermal expansion variations) can be avoided or at least reduced. The combination of the base end portion 252b and insulating support member 208, as well as the respective couplings thereto, act to isolate the emitter-cathode 252 from any stress-induced displacement (e.g., thermal expansion stress, residual spot-welding stress, stress from twisting during fabrication, etc.) and may thus be considered a mechanical drift isolation means 224.

To further isolate the position of the emitter-cathode 252 from the direct coupling of heating elements 206a, 206b, in some embodiments, the base end portion 252b can be made stiffer than the rest of the emitter-cathode 252, for example, by having an increased diameter as compared to middle portion 252c. For example, the base end portion 252b can have a diameter that is at least two times greater (e.g., three times or greater) than a diameter of the middle portion 252c of the emitter-cathode 252. Accordingly, when the middle portion 252c of the emitter-cathode 252 has a diameter of 50 μm to 500 μm, the base end portion 252b would have a diameter of at least 100 μm to 1 mm.

Electron Source Examples

FIG. 3A-3E illustrate a first example of an electron source 300. The electron source 300 has a Schottky-type emitter-cathode 310 with reservoir 324 (which would be omitted if emitter-cathode 310 is instead configured as a TFE or CF emitter), an insulating base 302, a pair of conductive terminals 304a, 304b, and a single heating element 306. The heating element 306 extends between the conductive terminals 304a, 304b and is coupled thereto via respective spot welds 314a, 314b. In the illustrated example, the heating element 306 is coupled to top surfaces of terminals 304a, 304b; however, it is also possible for the heating element 306 to instead be coupled to side surfaces of the terminals 304a, 304b, for example, in a manner similar to that illustrated in FIGS. 1A-1B.

The electron source 300 further has an insulating support member 308 and a drift isolation member 320. In the illustrated example, the insulating support member 308 is a cylindrical ceramic rod, and the drift isolation member 320 is a half-cylindrical metal rod. For example, the insulating support member 308 can have a diameter, $D_{ISM}$, of about 0.8 mm. As noted above, the drift isolation member can have a maximum lateral dimension that is at least two times (e.g., at least three times) larger than that of the emitter-cathode 310, the heating element 306, or both. For example, the emitter-cathode 310 can have a diameter, $D_{EC}$, of about 50-150 μm, and the heating element can have a diameter, $D_{HE}$, of less than about 250 μm. Accordingly, the drift isolation member 320 can have a diameter (or max lateral dimension), $W_{DIM}$, of, for example, about 0.3-0.5 mm. Of course, these dimensions are intended to be illustrative only, and other sizes and dimensions are also possible according to one or more contemplated embodiments.

The insulating support member 308 is coupled at one end thereof to a top surface 302t of the insulating base 302. The drift isolation member 320 is coupled (e.g., brazed) to an end of the insulating support member 308 that is opposite, along an axial direction 326 of the emitter-cathode 310, from the insulating base 302. Alternatively, in some embodiments, the insulating support member can be a cylindrical ceramic tube, such as tube 350 in FIG. 3F. Instead of being coupled to an end of the insulating support member, an end portion of the drift isolation member 320 can be disposed within a central recess or conduit 352 of the tube 350, and an outer circumferential wall 320o can be coupled (e.g., brazed) to an inner circumferential wall 350i of the tube 350. The diameter of conduit 352 can thus substantially match that of the drift isolation member 320, e.g., about 0.3-0.5 mm. In either case, the drift isolation member 320 can extend beyond the end of the insulating support member by a distance, $L_{DIM}$, of, for example, about 1-2 mm. Again, these dimensions are intended to be illustrative only, and other sizes and dimensions are also possible according to one or more contemplated embodiments.

Returning to FIGS. 3A-3E, the heating element 306 follows a generally arcuate U-shaped or V-shaped path between the conductive terminals 304a, 304b. The path shape (e.g., angle) and length of the heating element 306 can be varied to achieve a desired thermal profile. A mid-portion of the heating element 306 is coupled by spot weld 316 to an outer diameter side (e.g., curved side) of the drift isolation member 320. The emitter-cathode 310 is coupled by spot weld 312 to an inner diameter side (e.g., flat side) of the drift isolation member 320. The heating element 306 and the emitter-cathode 310 are thus disposed on opposite sides of the drift isolation member 320 and are indirectly coupled to each other via the intervening drift isolation member 320. In some embodiments, spot weld 316 can be substantially adjacent (e.g., such that a bottom edge of the heating element 306 where welded to the drift isolation member 320 is spaced from a top surface of the insulating support member 308 by a distance that is no more than two times the diameter, $D_{HE}$, of the heating element 306) to the insulating support member 308 along axial direction 326, while spot weld 312 can be disposed at about a center of the drift isolation member 320 along axial direction 326. Alternatively or additionally, spot weld 316 is closer to the insulating support member 308 than spot weld 312 (e.g., such that spot weld 316 is between spot weld 312 and insulating support member 308) along axial direction 326.

FIGS. 4A-4E illustrate a second example of an electron source 400. The electron source 400 is identical to that of FIGS. 3A-3E, except that the drift isolation member 420 is a rectangular bar instead of a half-cylindrical rod. As noted above, the drift isolation member 420 can have a maximum lateral dimension (e.g., a length of a side illustrate in FIG. 4E) that is at least two times (e.g., at least three times) larger than that of the emitter-cathode 310, the heating element 306, or both. A mid-portion of the heating element 306 is coupled by spot weld 416 to one side surface 420b of the drift isolation member 420, and the emitter-cathode 310 is coupled by spot weld 412 to an opposite side surface 420a of the drift isolation member. The heating element 306 and the emitter-cathode 310 are thus disposed on opposite sides of the drift isolation member 420 and are indirectly coupled to each other via the intervening drift isolation member 420. In some embodiments, spot weld 416 can be substantially adjacent to the insulating support member 308 along axial direction 326, while spot weld 412 can be disposed at about a center of the drift isolation member 420 along axial direction 326. Alternatively or additionally, spot weld 416 is closer to the insulating support member 308 than spot weld 412 (e.g., such that spot weld 416 is between spot weld 412 and insulating support member 308) along axial direction 326.

FIG. 4F illustrates a drift isolation member 440 that can be substituted for drift isolation member 320 in electron source 300 of FIGS. 3A-3E or for drift isolation member 420 in electron source 400 of FIGS. 4A-4E. FIG. 4G illustrates an electron source employing the drift isolation member 440. Drift isolation member 440 is similar in shape and operation to drift isolation member 320. However, drift isolation member 440 comprises an internal half-cylindrical rod 442 formed of a ceramic and an outer coating 444 formed of a metal. In some embodiments, the rod 442 can be formed of a ceramic that is same as the insulating support member 308 and/or the insulating base 302, for example, aluminum oxide or mullite.

In some embodiments, the outer coating 444 can be formed of a metal having a high stiffness (e.g., Re), as otherwise described above. However, in some embodiments, since the ceramic inner rod 442 already imbues the drift isolation member 440 with increased rigidity, the metal for coating 444 may be selected to optimize other properties. For example, since the coating 444 provides a surface for coupling the emitter-cathode 310 (e.g., via spot weld 446) and heating element 306 thereto, the metal for coating 444 can be selected to optimize, or at least improve, such coupling. Alternatively or additionally, the metal for coating 444 can be selected to optimize, or at least improve, thermal radiation properties.

FIGS. 5A-5E illustrate a third example of an electron source 500. The electron source is identical to that of FIGS. 4A-4E, except that the drift isolation member 520 is a U-shaped bar instead of a rectangular bar. In particular, the drift isolation member 520 has a first longitudinal arm 520a, a second longitudinal arm 520b, and a lateral strut or crossbar 520c connecting the first and second longitudinal arms together. A gap 522 separates the first and second longitudinal arms from each other, and the gap 522 is open at an end of the drift isolation member 520 opposite the crossbar 520c. When installed within the electron source 500, the first and second longitudinal arms 520a, 520b extend parallel to the axial direction 326 and the opening of the gap 522 faces toward the top surface of the insulating support member 308.

Figure 5A:
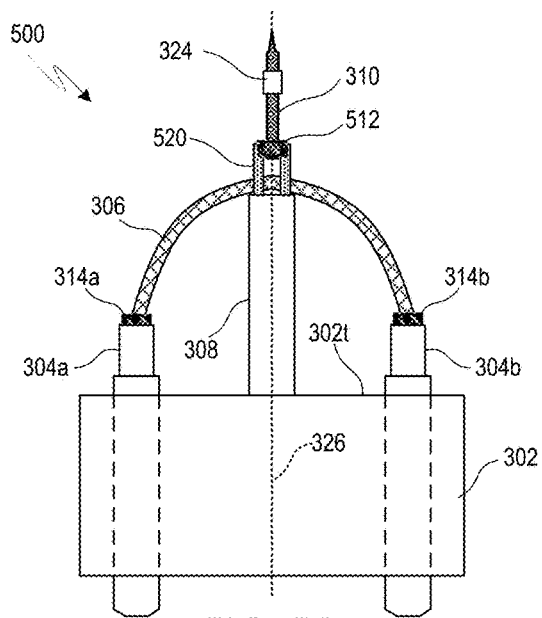
FIGS. 5A-5B are front and back elevation views, respectively, of a third exemplary electron source, according to one or more embodiments of the disclosed subject matter.
Figure 5B:
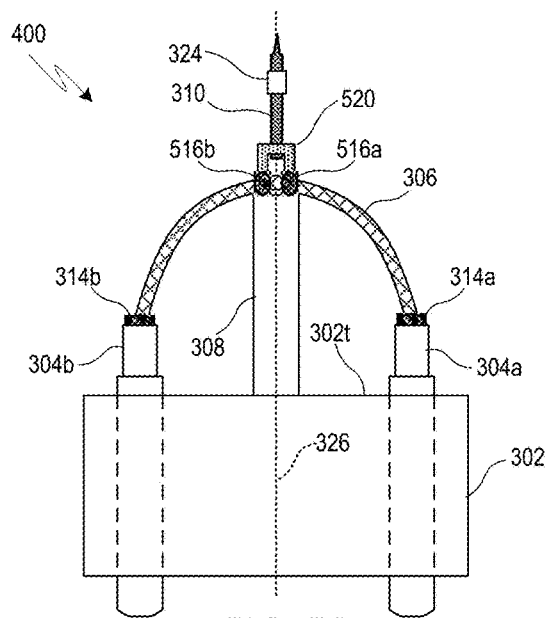
Figure 5C:
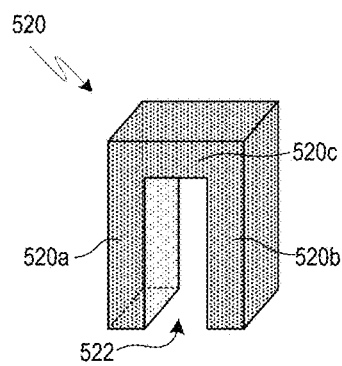
FIG. 5C is a simplified perspective view of the drift isolation member employed in the third exemplary electron source of FIGS. 5A-5B.
Figure 5D:
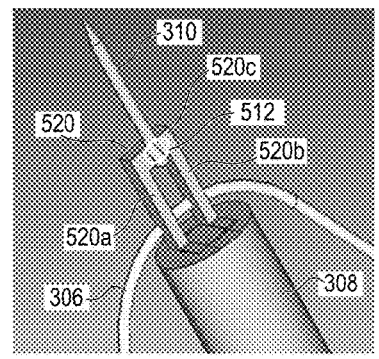
FIG. 5D is a detailed perspective view of the third exemplary electron source of FIGS. 5A-5B.
Figure 5E:
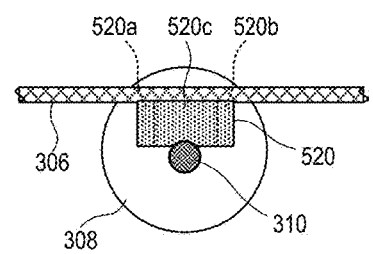
FIG. 5E is a simplified plan view illustrating the positional relationship between the heating element, drift isolation member, insulating support member, and emitter-cathode in the third exemplary electron source.

Similar to the previously described examples, the emitter-cathode 310 is coupled by spot weld 512 to one side of the drift isolation member 520. For example, the emitter-cathode 310 can be welded to a center portion of the crossbar 520c, as illustrated in FIGS. 5A, 5D, and 5E. The heating element 306 is also coupled to the to the drift isolation member 520 on a side opposite to that of the emitter-cathode 310, for example, in a region substantially adjacent to the insulating support member 308 along axial direction 326. However, since the drift isolation member 520 has a gap 522 at its center in this region, the heating element 306 can instead be coupled to each of the longitudinal arms 520a, 520b, for example, at spot weld 516a and spot weld 516b, as shown in FIG. 5B. As noted above, the drift isolation member 520 can have a maximum lateral dimension (e.g., a length or width of crossbar 520c in FIG. 5E) that is at least two times (e.g., at least three times) larger than that of the emitter-cathode 310, the heating element 306, or both.

Figure 5F:
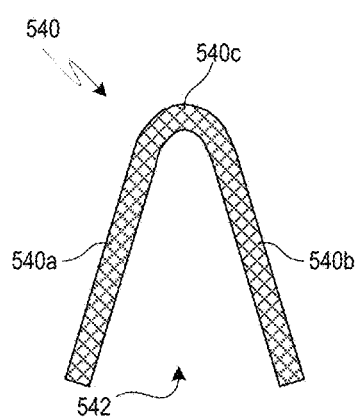
FIG. 5F is a simplified side view of a variation of a drift isolation member that can be employed in any of the first through third exemplary electron sources.
Figure 5G:
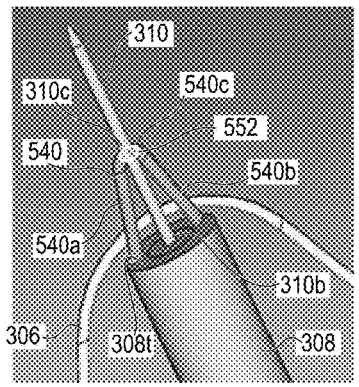
FIG. 5G is a detailed perspective view illustrating a variation of the third exemplary electron source employing the drift isolation member of FIG. 5F, according to one or more embodiments of the disclosed subject matter.
Figure 5H:
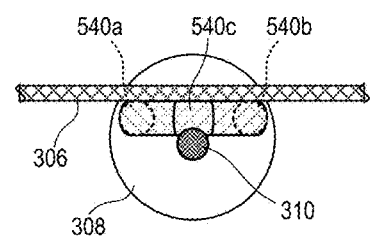
FIG. 5H is a simplified plan view illustrating the positional relationship between the heating element, drift isolation member, insulating support member, and emitter-cathode in the electron source of FIG. 5G.

FIG. 5F illustrates a drift isolation member 540 that can be substituted for drift isolation member 520 in electron source 500 of FIGS. 5A-5E. FIGS. 5G-5H illustrate an electron source employing the drift isolation member 540. Drift isolation member 540 has a pair of angled arms 540a, 540*b* that meet at peak 540*c*, thereby forming a V-shape. A gap 542 separates the angled arms 540*a*, 540*b* from each other, and the gap 542 is open at an end of the drift isolation member 540 opposite the peak 540*c*. When installed within an electron source, the angled arms 540*a*, 540*b* extend in directions crossing the axial direction 326, such that the peak 540*c* is coincident with the axial direction 326 at a location remote insulating support member 308.

Similar to the previously described examples, the emitter-cathode 310 is coupled by spot weld 552 to one side of the drift isolation member 540. For example, the emitter-cathode 310 can be welded to the peak 540*c*, as illustrated in FIGS. 5G and 5H. The heating element 306 is also coupled to the to the drift isolation member 540 on a side opposite to that of the emitter-cathode 310, for example, in a region substantially adjacent to the insulating support member 308 along axial direction 326. However, since the drift isolation member 540 has a gap 542 at its center in this region, the heating element 306 can instead be coupled to each of the angled arms 540*a*, 540*b*. As noted above, the drift isolation member 540 can have a maximum lateral dimension (e.g., a length or width of peak 540*c* in FIG. 5H) that is at least two times (e.g., at least three times) larger than that of the emitter-cathode 310, the heating element 306, or both.

In some embodiments, the drift isolation member 540 can be formed of a metal having a high stiffness (e.g., Re), as otherwise described above. Alternatively, the drift isolation member 540 can be formed of a same material as the heating element 306. For example, both the heating element 306 and the drift isolation member 540 can be formed of tantalum filament. In some embodiments, the drift isolation member 540 and the heating element 306 are both formed of a metal filament, but the heating element 306 is modified to be more flexible than the drift isolation member 540, for example, by having a smaller diameter and/or by having a reduced diameter proximal to the conductive terminals 304*a*, 304*b* (e.g., at spot welds 314*a*, 314*b*).

FIG. 5G further illustrates another optional variation for an electron source, in particular, where the emitter-cathode 310 is coupled to the drift isolation member at mid-portion 310*c* (e.g., via spot weld 552) rather than at base end portion 310*b*. Instead, the base end portion 310*b* is disposed proximal to top surface 308*t* of insulating support member 308, but separated therefrom by a narrow gap. Alternatively, in some embodiments, the base end portion 310*b* of emitter-cathode 310 can be disposed in contact with the top surface 308*t* of insulating support member 308. Alternatively, in some embodiments, the base end portion 310*b* of emitter-cathode 310 can be coupled (e.g., braised) to the top surface 308*t* of insulating support member 308. Such configurations for the emitter-cathode can be applied to any of the other electron source configurations described herein, including those of FIGS. 3A-3E, 4A-4G, 5A-5E, 6A-6J, and 8A-8B.

FIGS. 6A-6D illustrate a fourth example of an electron source 600. The electron source is identical to that of FIGS. 5A-5E, except that two separate heating elements 606*a*, 606*b* are used instead of a single heating element. In particular, a first heating element 606*a* extends from conductive terminal 304*a* and is coupled thereto by spot weld 314*a*, and a second heating element 606*b* extends from conductive terminal 304*b* and is coupled thereto by spot weld 314*b*. In the illustrated example, each heating element 606*a*, 606*b* is coupled to respective top surfaces of terminals 304*a*, 304*b*; however, it is also possible for the heating elements to instead be coupled to side surfaces of the terminals 304*a*, 304*b*, for example, in a manner similar to that illustrated in FIGS. 1A-1B.

Heating element 606*a* follows a partial-arcuate path from conductive terminal 304*a* to a sidewall of longitudinal arm 520*a* of the drift isolation member 520, and heating element 606*b* follows another partial-arcuate path (e.g., a mirror version of heating element 606*a* with respect to axial direction 326) from conductive terminal 304*b* to a sidewall of longitudinal arm 520*b* of the drift isolation member 520. Each heating element 606*a*, 606*b* is coupled to the corresponding sidewall of the drift isolation member 520 by spot welds 616*a*, 616*b*, respectively. Alternatively, each heating element 606*a*, 606*b* can instead be coupled to sides of the longitudinal arms 520*a*, 520*b* opposite the emitter-cathode 310, in a manner similar to that described above for FIG. 5E. The provision of separate heating elements 606*a*, 606*b* (e.g., separated by gap 522 of drift isolation member 520) can lead to improved thermal performance, at least as compared to the configuration of FIGS. 5A-5E. In some embodiments, the path shape (e.g., angle) and length of each heating element 606*a*, 606*b* can be varied to achieve a desired thermal profile. However, in general, it may be desirable to have a same shape and length for the heating elements 606*a*, 606*b* in order to avoid asymmetries that may lead to thermally-induced stresses on the drift isolation member 520.

Figure 6A:
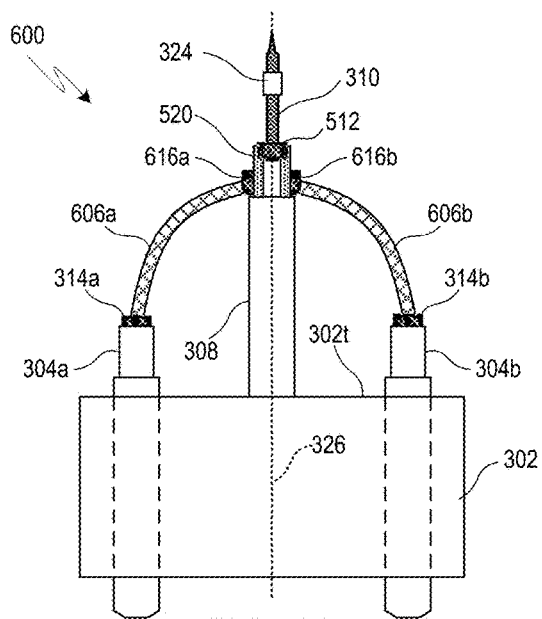
FIGS. 6A-6B are front and back elevation views, respectively, of a fourth exemplary electron source, according to one or more embodiments of the disclosed subject matter.
Figure 6B:
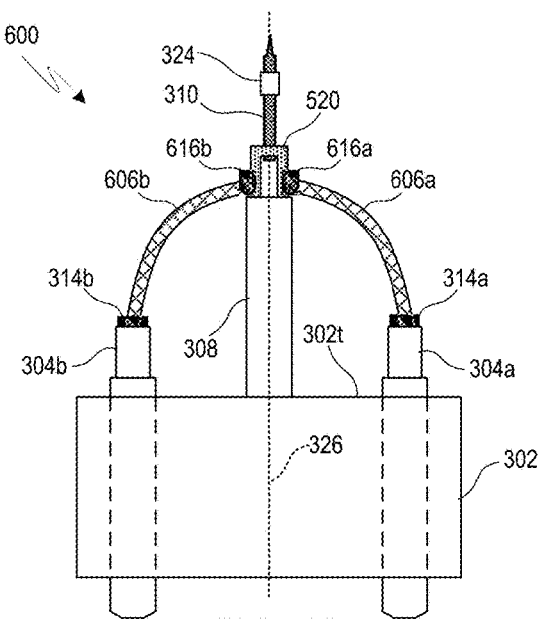
Figure 6C:
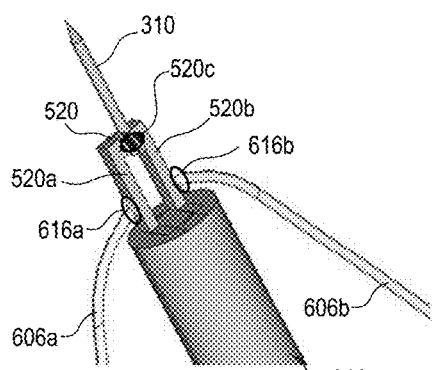
FIG. 6C is a detailed perspective view of the fourth exemplary electron source of FIGS. 6A-6B.
Figure 6D:
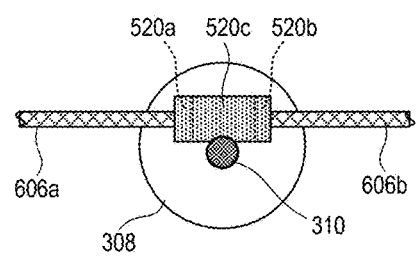
FIG. 6D is a simplified plan view illustrating the positional relationship between the heating elements, drift isolation member, insulating support member, and emitter-cathode in the fourth exemplary electron source.
Figure 6E:
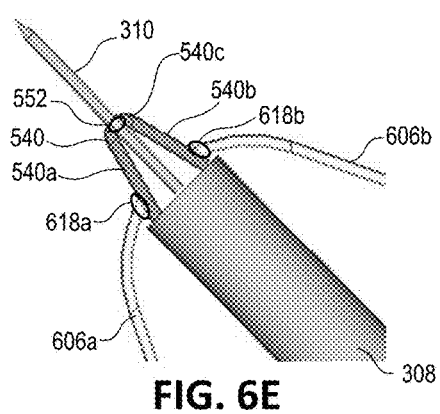
FIG. 6E is a detailed side view illustrating a variation of the fourth exemplary electron source employing the drift isolation member of FIG. 5F, according to one or more embodiments of the disclosed subject matter.
Figure 6F:
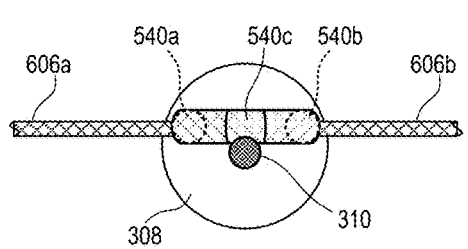
FIG. 6F is a simplified plan view illustrating the positional relationship between the heating elements, drift isolation member, insulating support member, and emitter-cathode in the electron source of FIG. 6E.

FIGS. 6E-6F illustrate a variation with drift isolation member 540 of FIG. 5F substituted for drift isolation member 520 in the electron source of FIGS. 6A-6D. Similar to the previously described examples, the emitter-cathode 310 is coupled by spot weld 552 to one side of the drift isolation member 540. For example, the emitter-cathode 310 can be welded to the peak 540*c*, as illustrated in FIGS. 6E and 6F. In addition, each heating element 606*a*, 606*b* is coupled to the corresponding sidewall of the drift isolation member 540 by spot welds 618*a*, 618*b*, respectively. Alternatively, each heating element 606*a*, 606*b* can instead be coupled to sides of the angled arms 540*a*, 540*b* opposite the emitter-cathode 310, in a manner similar to that described above for FIG. 5H.

Figure 6G:
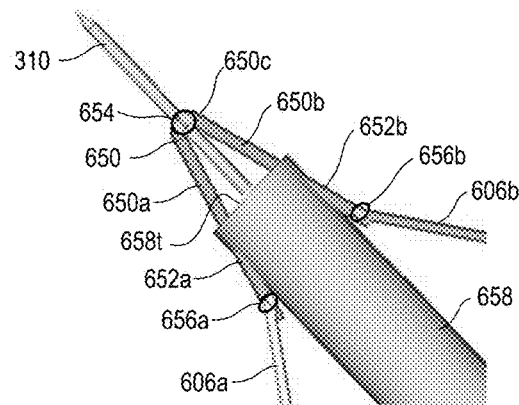
FIG. 6G is a detailed side illustrating another variation of the fourth exemplary electron source employing a variation of the drift isolation member of FIG. 5F, according to one or more embodiments of the disclosed subject matter.
Figure 6H:
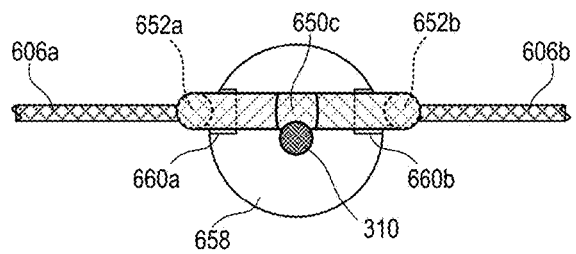
FIG. 6H is a simplified plan view illustrating the positional relationship between the heating elements, drift isolation member, insulating support member, and emitter-cathode in the electron source of FIG. 6G.

FIGS. 6G-6H illustrate a further variation where the drift isolation member of FIG. 5F has been extended beyond the top surface of the insulating support member. For example, an insulating support member 658 can have a pair of channels or recesses 660*a*, 660*b* within a top surface 658*t* thereof. Similar to drift isolation member 540, drift isolation member 650 has a pair of angled arms 650*a*, 650*b* that meet at peak 650*c*. The emitter-cathode 310 can be coupled by spot weld 652 to one side of the drift isolation member 650, for example, at peak 650*c*. In addition, each heating element 606*a*, 606*b* can be coupled to a respective one of the arms 650*a*, 650*b*, for example, via respective spot welds 656*a*, 656*b*. However, in contrast to previous examples, each arm 650*a*, 650*b* has a lower end portion 652*a*, 652*b* that fits within channels 660*a*, 660*b* in the insulating support member 658, so as to extend below a top surface 658*t* of the insulating support member and beyond an outer circumference of the insulating support member 658. In some embodiments, the drift isolation member 650 can be coupled to the insulating support member 658 by brazing the lower end portions 652*a*, 652*b* within channels 660*a*, 660*b*. Accordingly, the spot welds 656*a*, 656*b* are kept farther from the spot weld 654 for the emitter-cathode 310 and are further isolated by the coupling to insulating support member 658, which may yield further improvements in mechanical isolation and/or thermal performance for the resulting electron source.

Figure 6I:
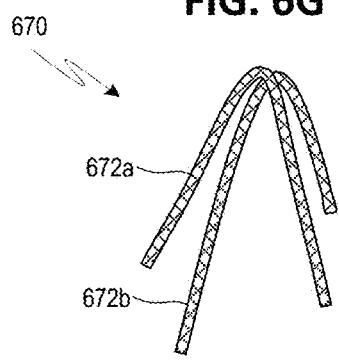
FIG. 6I is a simplified perspective view of a variation employing multiple drift isolation members for use in any of the first through fourth exemplary electron sources, according to one or more embodiments of the disclosed subject matter.
Figure 6J:
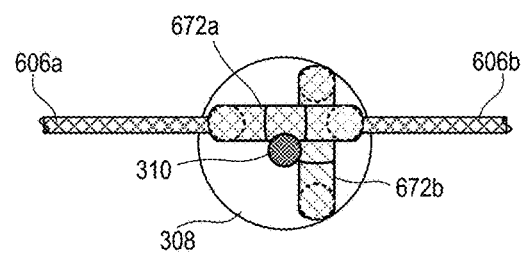
FIG. 6J is a simplified plan view illustrating the positional relationship between the heating elements, drift isolation members, insulating support member, and emitter-cathode in an electron source employing the variation of FIG. 6I, according to one or more embodiments of the disclosed subject matter.

FIGS. 6I-6J illustrate a further variation for an isolation structure 670 employing multiple drift isolation members 672*a*, 672*b*. For example, each drift isolation member 672*a*, 672*b* can be substantially identical to the drift isolation member 540 illustrated in FIG. 5F. However, one of the drift isolation members 672a, 672b may have a different size or shape compared to the other, for example, to allow for the drift isolation members to be arranged in an orthogonal orientation, as shown in FIGS. 6I-6J. Each of the drift isolation members 672a, 672b can be coupled (e.g., via brazing) to the insulating support member 308. Alternatively or additionally, the drift isolation members 672a, 672b can be coupled to each other, for example, by welding together sections proximal to the respective peaks. In some embodiments, the emitter-cathode 310 can be coupled to one or both of the drift isolation members 672a, 672b, for example, with emitter-cathode 310 disposed at an inner corner formed by the orthogonal arrangement, as shown in FIG. 6J. Such isolation structures 670 may further improve mechanical isolation of the emitter-cathode.

Figure 7B:
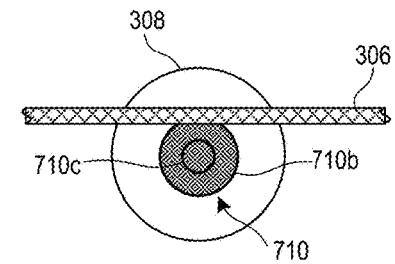
FIG. 7B is a simplified plan view illustrating the positional relationship between the heating element, insulating support member, and emitter-cathode in the fifth exemplary electron source.
Figure 7A:
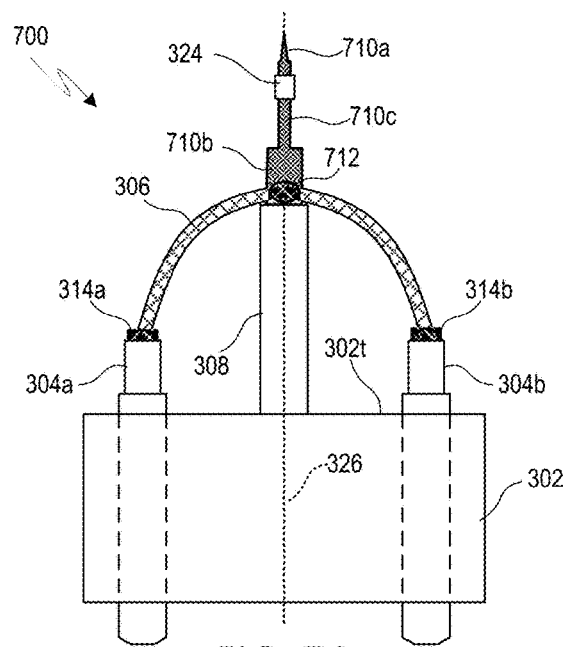
FIG. 7A is a front elevation view of a fifth exemplary electron source, according to one or more embodiments of the disclosed subject matter.

FIG. 7A-7B illustrate a fifth example of an electron source 700. The electron source 700 has a Schottky-type emitter-cathode 710 with reservoir 324 (which would be omitted if emitter-cathode 310 is instead configured as a TFE or CF emitter), an insulating base 302, a pair of conductive terminals 304a, 304b, and a single heating element 306. The emitter-cathode 710 includes an emitter tip 710a, a base end portion 710b, and a middle portion 710c between the emitter tip 710a and the base end portion 710b along the axial direction 326. The electron source 700 further has an insulating support member 308 coupled at one end thereof to a top surface 302t of the insulating base 302. The base end portion 710b of the emitter-cathode 710 is coupled (e.g., brazed) to an end of the insulating support member 308 that is opposite, along the axial direction 326, from the insulating base 302.

The heating element 306 extends between the conductive terminals 304a, 304b and is coupled thereto via respective spot welds 314a, 314b. In the illustrated example, the heating element 306 is coupled to top surfaces of terminals 304a, 304b; however, it is also possible for the heating element 306 to instead be coupled to side surfaces of the terminals 304a, 304b, for example, in a manner similar to that illustrated in FIGS. 1A-1B. The heating element 306 follows a generally arcuate U-shaped or V-shaped path between the conductive terminals 304a, 304b. The path shape (e.g., angle) and length of the heating element 306 can be varied to achieve a desired thermal profile. A mid-portion of the heating element 306 is coupled by spot weld 712 to the base end portion 710b.

Since the heating element 306 is directly coupled to the emitter-cathode 710, the emitter may be more susceptible to mechanical drift. To further enhance the stability, in some embodiments, spot weld 712 can be substantially adjacent (e.g., such that a bottom edge of the heating element 306 where welded to the base end portion 710b is spaced from a top surface of the insulating support member 308 by a distance that is no more than two times the diameter, $D_{HE}$, of the heating element 306) to the insulating support member 308 along axial direction 326. Alternatively or additionally, the location of spot weld 712 can be closer to the insulating support member 308 along the axial direction 326 than to the reservoir 324.

In addition, in some embodiments, the base end portion 710b (or a sub-portion thereof) can have an enlarged diameter in order to increase stiffness thereof. The spot weld 712 is then located within this enlarged diameter portion. For example, base end portion 710b can have diameter that is at least two times (e.g., at least three times) larger than that of the middle portion 710c of the emitter-cathode 710, the heating element 306, or both. For example, the middle portion 710c of emitter-cathode 710 can have a diameter of about 50-150 and the heating element can have a diameter of less than about 250 μm. Accordingly, the base end portion 710b can have a diameter of, for example, about 0.5-0.8 mm. Of course, these dimensions are intended to be illustrative only, and other sizes and dimensions are also possible according to one or more contemplated embodiments. Alternatively, in some embodiments, the disposition of the spot weld 712 proximal to the junction between the emitter-cathode and the insulating support member 308 may be sufficient to avoid mechanical instability without further modifications. Accordingly, in such embodiments, an emitter-cathode 310 can have a substantially constant diameter along its length for at least the base end portion 310b and middle portion 310c, as shown, for example, in FIG. 7C.

Figure 8A:
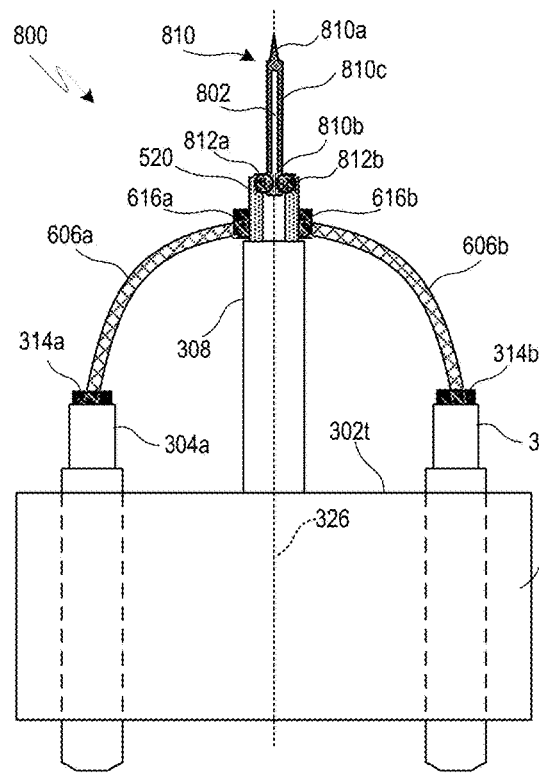
FIGS. 8A-8B are front and back elevation views, respectively, of a sixth exemplary electron source, according to one or more embodiments of the disclosed subject matter.
Figure 8B:
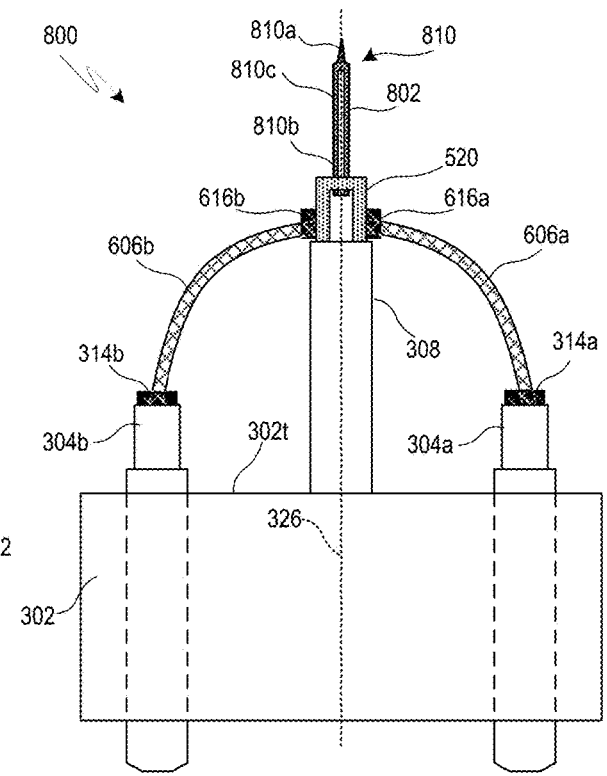

FIGS. 8A-8B illustrate a sixth example of an electron source 800. The electron source is identical to that of FIGS. 6A-6D, except that the emitter-cathode 810 has a split configuration. In particular, the emitter-cathode 810 has an axially-extending gap 802 extending through base end portion 810b and middle portion 810c. The gap 802 can terminate prior to reaching the emitter tip 810a. Similar to the previously described examples, the emitter-cathode 810 is coupled to the drift isolation member 520, in particular to a side of the crossbar 520c. For example, multiple spot welds 812a, 812b can be used on opposite sides of base end portion 810b to couple it to the drift isolation member 520 while allowing gap 802 to remain open or exposed. Alternatively, a single spot weld can be used to couple the base end portion 810b to the side of the crossbar 520c, in a manner similar to that described for FIGS. 5A-5E and 6A-6D. Alternatively, the base end portion 810b can be coupled to a top surface of crossbar 520c by one or more spot welds, in which case gap 802 may otherwise be closed by contact with the drift isolation member 520. The split configuration for the emitter-cathode 810 may further enhance thermal performance.

Figure 8C:
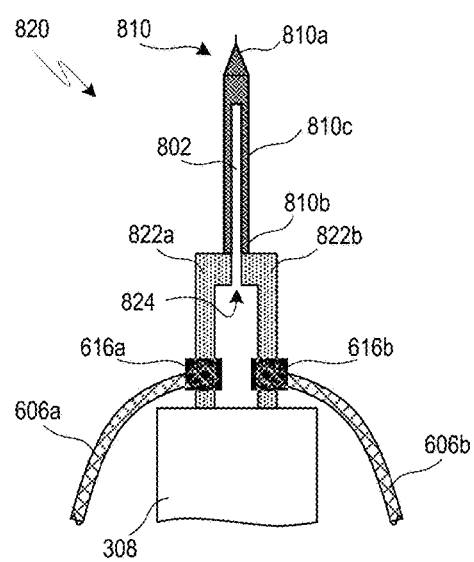
FIG. 8C is a detailed side view of a variation of the sixth exemplary electron source of FIGS. 8A-8B, according to one or more embodiments of the disclosed subject matter.

FIG. 8C illustrates a variation 820 that substitutes drift isolation members 822a, 822b for drift isolation member 520 in the electron source of FIGS. 8A-8B. Drift isolation members 822a, 822b can be mirror images of each other with respect to the axial direction. The drift isolation members 822a, 822b can be separated by a gap 824, which can be aligned, or at least overlapping, with axially-extending gap 802 of the emitter-cathode 810. In essence, the drift isolation members 822a, 822b provide a shape similar to that of drift isolation member 520 but split into separate components by the gap 824. Such a configuration may lead to further improvements in mechanical isolation and thermal performance.

Fabrication Examples

Figure 9:
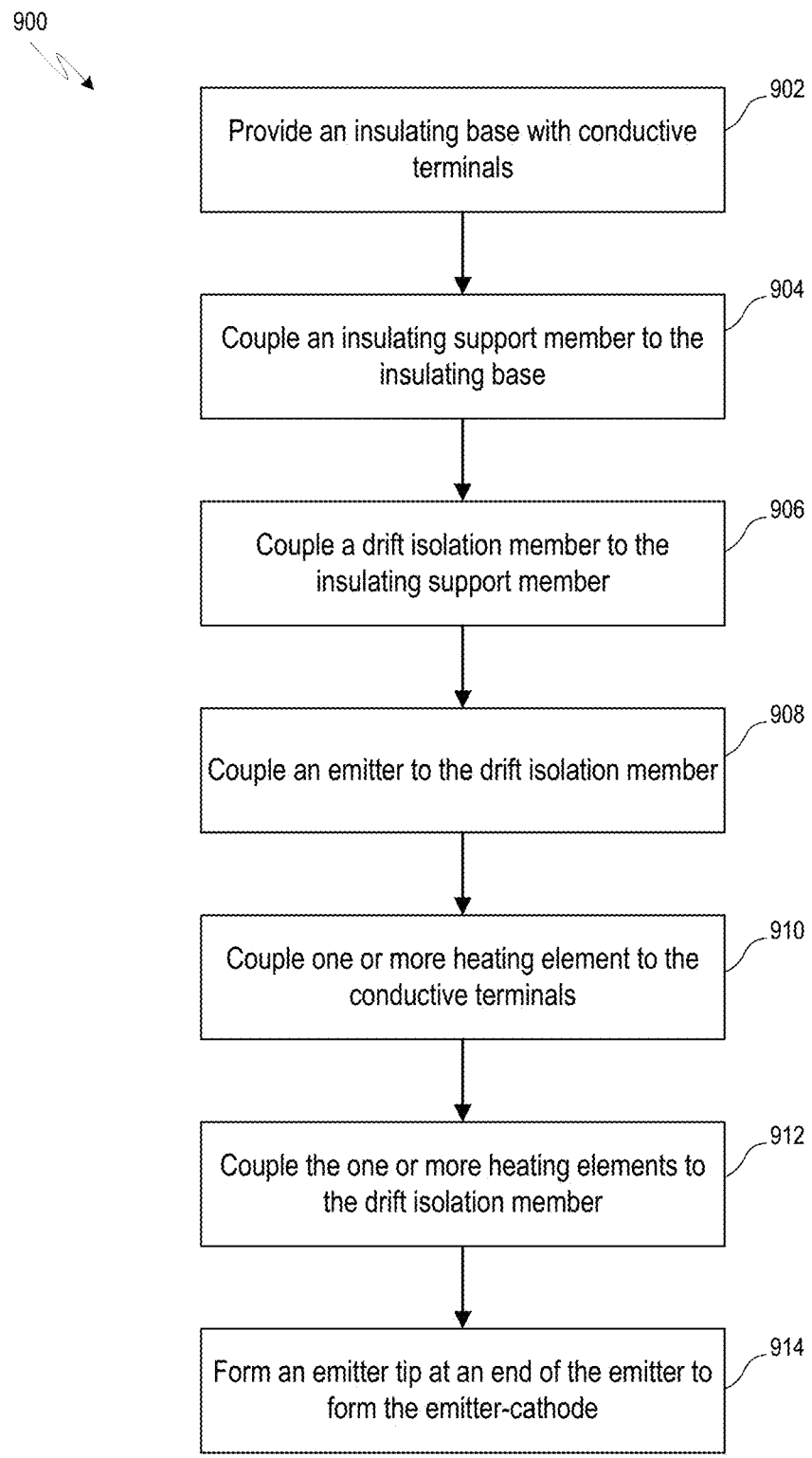
FIG. 9 is a process flow diagram for an exemplary method of manufacturing an electron source, according to one or more embodiments of the disclosed subject matter.

FIG. 9 illustrates an exemplary method 900 for fabricating a mechanically-stable electron source. The method 900 can initiate at process block 902, by providing an insulating base with conductive terminals. In some embodiments, the providing of process block 902 can include forming appropriate conduits within an insulating base (e.g., ceramic base), inserting conductive terminals (e.g., metal post) within the conduits, and coupling the conductive terminals to the insulating base (e.g., via brazing or soldering). In some embodiments, the conductive terminals are exposed from a top surface of the insulating base.

Figure 10A:
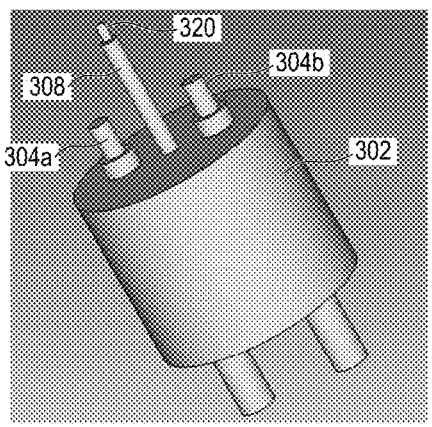
FIGS. 10A-10B are perspective and detailed perspective views, respectively, illustrating assembly of a drift isolation member in an exemplary manufacturing method, according to one or more embodiments of the disclosed subject matter.

The method 900 can proceed to process block 904, where an insulating support member is coupled to the insulating base. For example, the insulating support member and the insulating base are both formed of ceramic, and one end of the insulating support member can be coupled to the top surface of the insulating base (e.g., via sintering). Alternatively, in some embodiments, the insulating support member can be formed from the insulating base instead of coupling a separate member thereto. In such embodiments, the coupling of process block 904 is replaced with a forming of the insulating support member, for example, by etching or machining a top surface of the insulating base to form an axially-extending protrusion as the insulating support member. In some embodiments, the insulating support member 308 is formed or coupled to the insulating base 302 to extend farther from the top surface thereof than the conductive terminals 304a, 304b, for example, as shown in FIG. 10A.

Figure 10B:
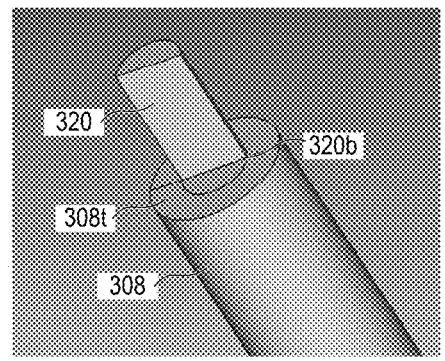
Figure 10C:
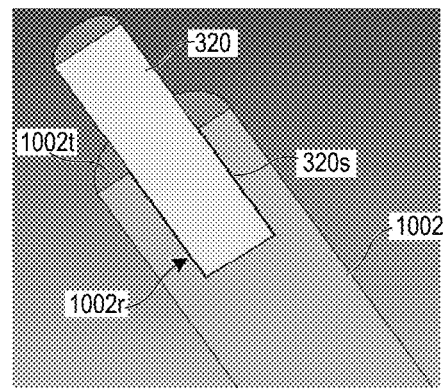
FIG. 10C is a detailed perspective view illustrating a variation for assembly of the drift isolation member, according to one or more embodiments of the disclosed subject matter.

The method 900 can proceed to process block 906, where a drift isolation member is coupled to the insulating support member. FIG. 10A-10B illustrates exemplary coupling of a drift isolation member 320, in the form of a half-cylindrical metal rod, to insulating support member 308, in the form of a solid ceramic rod. For example, an axial end 320b of the drift isolation member 320 can be brazed to the top surface 308t of the insulating support member 308. Alternatively, in some embodiments, a recess 1002r can be formed in the insulating support member 1002, and an end portion of the drift isolation member 320 can be inserted in the recess 1002r, as shown in FIG. 10C. The circumferential surface 320s of the inserted end portion of the drift isolation member 320 can be braised to the surface of the recess 1002r, while the remaining portion of the drift isolation member 320 projects above the top surface 1002t of the insulating support member 1002. Alternatively, in some embodiments, the insulating support member is constructed as a cylindrical tube, and an end portion of the drift isolation member is disposed therein in a manner similar to that illustrated in FIG. 10C.

Figure 11A:
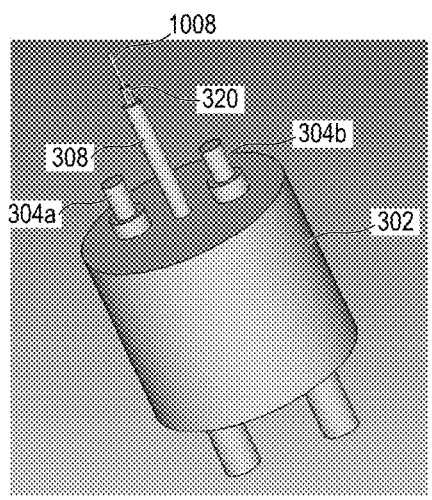
FIGS. 11A-11B are perspective and detailed perspective views, respectively, illustrating assembly of an emitter in an exemplary manufacturing method, according to one or more embodiments of the disclosed subject matter.
Figure 11B:
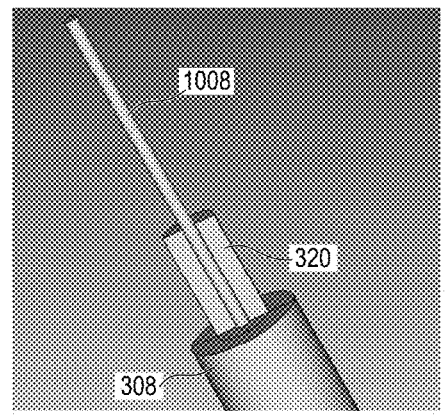

Returning to FIG. 9, the method 900 can proceed to process block 908, where an emitter-cathode is coupled to the drift isolation member. FIGS. 11A-11B illustrate exemplary coupling of an emitter blank 1008 to the drift isolation member 320. For example, the emitter blank 1008 (also referred to herein simply as emitter) can be disposed on a flat side of the half-cylindrical metal rod of drift isolation member 320 and coupled thereto using one or more spot welds. For example, the emitter blank 1008 can comprise a single crystal rod of tungsten.

Figure 12A:
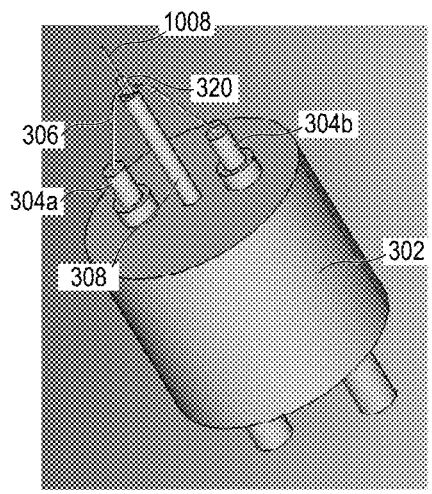
FIGS. 12A-12B are perspective and detailed perspective views, respectively, illustrating assembly of heating elements in an exemplary manufacturing method, according to one or more embodiments of the disclosed subject matter.
Figure 12B:
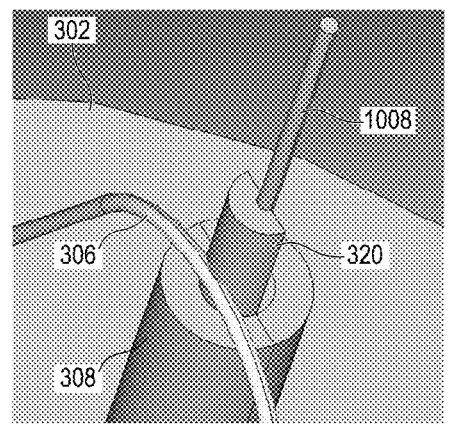

Returning to FIG. 9, the method 900 can proceed to process block 910, where one or more heating elements are coupled to the conductive terminals, and to process block 912, where the heating elements are coupled to the drift isolation member. FIGS. 12A-12B illustrate exemplary coupling of heating element 306 to the conductive terminals 304a, 304b and drift isolation member 320. For example, the heating element 306 can be coupled at respective ends thereof to conductive terminals 304a, 304b (e.g., top surfaces, side surfaces, or any other part of terminals 304a, 304b) via respective spot welds. For example, a middle part of the heating element 306 can be disposed on a rounded outer side of the half-cylindrical metal rod of drift isolation member 320 and coupled thereto using one or more spot welds. As discussed in detail above, the spot welds coupling the heating element 306 to the drift isolation member 320 can be located substantially adjacent to the junction between the drift isolation member 320 and the insulating support member 308 (e.g., the top surface 308t), while the spot welds coupling the emitter blank 1008 to the drift isolation member 320 can be located closer to a center of the drift isolation member 320 along the axial direction.

In some embodiments, the heating element can be modified to have a variable diameter. For example, ends of the heating element 306 coupled to the conductive terminals 304a, 304b can have a reduced diameter as compared to the middle portion coupled to the drift isolation member 320. The diameter at the ends of the heating element 306 can be reduced prior to or after the coupling to the conductive terminals. For example, the diameter at the ends of the heating element 306 can be reduced by electrochemical etching or grinding. Other diameter reduction methods are also possible according to one or more contemplated embodiments. Alternatively, the heating element 306 can be manufactured with a variable diameter (e.g., via wire drawing) instead of subjecting the heating element to post-manufacturing modification.

Figure 13A:
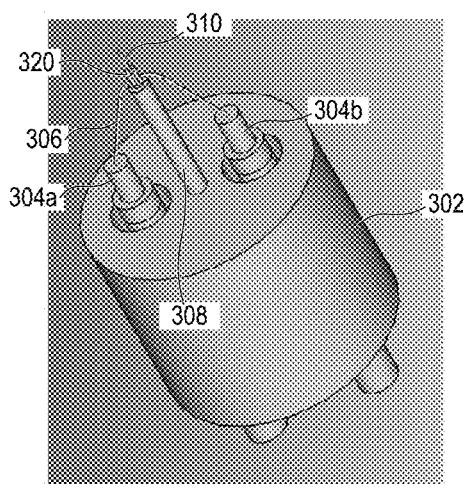
FIGS. 13A-13B are perspective and detailed perspective views, respectively, illustrating formation of an emitter tip in an exemplary manufacturing method, according to one or more embodiments of the disclosed subject matter.
Figure 13B:
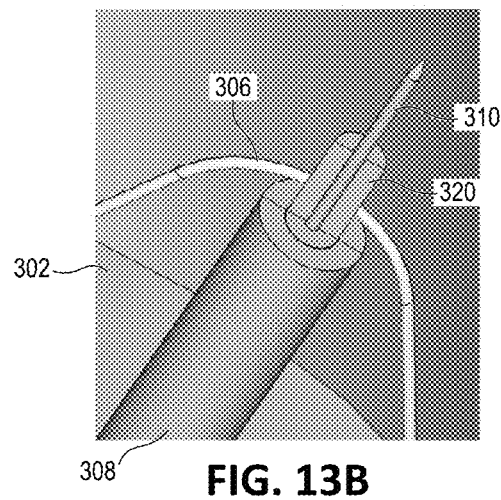

Returning to FIG. 9, the method 900 can proceed to process block 914, where an emitter tip is formed at the end of the emitter blank. FIGS. 13A-13B illustrate exemplary forming of the emitter tip for the emitter-cathode 310 from the emitter blank 1008. For example, the emitter blank 1008 can be etched to form a sharp emitter. In some embodiments, when the emitter-cathode is of the Schottky type, process block 914 may further include coating the emitter blank to form a reservoir. For example, the coating can comprise zirconium oxide. The reservoir can be located closer to the tip of the emitter-cathode than to the spot welds that couple the heating element 306 to the drift isolation member. After process block 914, the resulting electron source can be ready for use, and the fabrication method 900 may conclude.

Although process blocks 902-914 of method 900 have been separately illustrated in FIG. 9, in some embodiments, process blocks may be combined and performed together (simultaneously or sequentially). Moreover, although FIG. 9 illustrates a particular order for blocks 902-914 of method 900, embodiments of the disclosed subject matter are not limited thereto. Indeed, in certain embodiments, the blocks may occur in a different order than illustrated or simultaneously with other blocks. For example, the coupling of the heating elements to the drift isolation member in process block 912 may occur before the coupling of the heating elements to the conductive terminals in process block 910. In another example, the forming the tip of the emitter-cathode in process block 914 may occur before the coupling of the emitter blank to the drift isolation member in process block 908. Accordingly, embodiments of the disclosed subject matter are not limited to the specific order illustrated in FIG. 9 and described above.

Figure 7C:
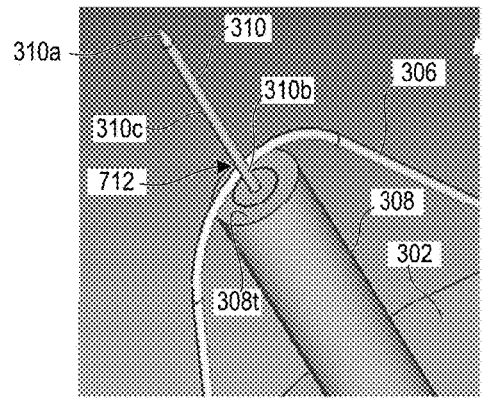
FIG. 7C is a detailed perspective view of a variation of the fifth exemplary electron source of FIGS. 7A-7B.

In a variation of the fabrication method 900, process blocks 906, 908 can be omitted in favor of coupling the emitter blank directly to the insulating support member, for example, as illustrated in FIG. 7A-7C. In such embodiments, process block 912 can also be omitted in favor of coupling the heating element directly to the emitter blank. However, coupling of the heating element to the emitter blank is at a location substantially adjacent to the junction between the emitter blank and the insulating support member (e.g., top surface 308t) to reduce impact of any stress-induced variations from heating element on position of emitter-cathode. In some embodiments, process block 914 can further include shaping the emitter blank to form an enlarged diameter end portion to which the heating element is coupled and/or to form a middle portion with a reduced diameter as compared to the end portion. Alternatively, in some embodiments, the emitter blank can be formed with an enlarged diameter end portion prior to the coupling of the emitter blank to the insulating support member.

Additional Examples of the Disclosed Technology

In view of the above described implementations of the disclosed subject matter, this application discloses the additional examples in the clauses enumerated below. It should be noted that one feature of a clause in isolation, or more than one feature of the clause taken in combination, and, optionally, in combination with one or more features of one or more further clauses are further examples also falling within the disclosure of this application.

Clause 1. An electron source, comprising:
an insulating base;
a pair of conductive terminals exposed from a first surface of the insulating base;
an insulating support member extending from the first surface of the insulating base;
a drift isolation member disposed at an end of the insulating support member remote from the insulating base;
an emitter-cathode coupled to the drift isolation member; and
one or more heating elements coupled to the conductive terminals and the drift isolation member.

Clause 2. The electron source of any clause or example herein, in particular Clause 1, wherein the insulating base is formed of a first ceramic, and/or the insulating support member is formed of a second ceramic.

Clause 3. The electron source of any clause or example herein, in particular Clause 2, wherein one or both of the first ceramic and the second ceramic comprise aluminum oxide ($Al_2O_3$) or mullite ($3Al_2O_3.2SiO_2$ or $2Al_2O_3.SiO_2$).

Clause 4. The electron source of any clause or example herein, in particular any one of Clauses 1-3, wherein the insulating support member comprises a ceramic rod, and the drift isolation member is coupled to an axial end surface of the ceramic rod.

Clause 5. The electron source of any clause or example herein, in particular any one of Clauses 1-3, wherein the insulating support member comprises a ceramic tube, and at least a portion of the drift isolation member is disposed within the ceramic tube and coupled to an inner circumferential surface thereof.

Clause 6. The electron source of any clause or example herein, in particular any one of Clauses 1-5, wherein the emitter-cathode is welded to a first side of the drift isolation member, and/or the one or more heating elements are welded to a second side of the drift isolation member opposite to the first side.

Clause 7. The electron source of any clause or example herein, in particular any one of Clauses 1-6, wherein the one or more heating elements are welded to the drift isolation member at one or more respective first locations, and/or the emitter-cathode is welded to the drift isolation member at a second location, and/or the one or more first locations are closer to the insulating support member than the second location along an axial direction of the emitter-cathode.

Clause 8. The electron source of any clause or example herein, in particular Clause 7, wherein the first locations are substantially adjacent to a junction between the drift isolation member and the insulating support member.

Clause 9. The electron source of any clause or example herein, in particular any one of Clauses 1-8, wherein the drift isolation member comprises a first metal, and/or the heating element comprises a second metal, and/or the emitter-cathode comprises a third metal.

Clause 10. The electron source of any clause or example herein, in particular Clause 9, wherein the drift isolation member comprises a ceramic member coated with the first metal.

Clause 11. The electron source of any clause or example herein, in particular any one of Clauses 9-10, wherein the first metal has a modulus of elasticity that is greater than that of the second metal.

Clause 12. The electron source of any clause or example herein, in particular any one of Clauses 9-11, wherein the second metal has an electrical resistivity of greater than 100 nΩ·m and/or a modulus of elasticity less than 200 GPa; or wherein the second metal has an electrical resistivity of greater than 50 nΩ·m and/or a modulus of elasticity less than 400 GPa.

Clause 13. The electron source of any clause or example herein, in particular any one of Clauses 9-12, wherein the first metal has a modulus of elasticity of at least 400 GPa.

Clause 14. The electron source of any clause or example herein, in particular any one of Clauses 9-13, wherein the first metal is rhenium (Re) and/or alloys thereof, and/or the second metal is tantalum (Ta) and/or alloys thereof, and/or the third metal is tungsten (W) and/or alloys thereof.

Clause 15. The electron source of any clause or example herein, in particular any one of Clauses 1-14, wherein the drift isolation member has a maximum lateral dimension in plane perpendicular to a direction of extension of the emitter-cathode, and the maximum lateral dimension is at least two times greater than a maximum diameter of the emitter-cathode.

Clause 16. The electron source of any clause or example herein, in particular any one of Clauses 1-15, wherein the emitter-cathode is constructed as a Schottky emitter with a reservoir, and the reservoir is disposed along an axial direction of the emitter-cathode closer to a tip of the emitter-cathode than to the drift isolation member.

Clause 17. The electron source of any clause or example herein, in particular Clause 16, wherein the reservoir comprises a coating of zirconium oxide ($ZrO_2$).

Clause 18. The electron source of any clause or example herein, in particular any one of Clauses 1-15, wherein the emitter-cathode is constructed as a thermal field or cold field emitter without a reservoir.

Clause 19. The electron source of any clause or example herein, in particular any one of Clauses 1-18, wherein the one or more heating elements have a diameter less than 127 μm (5 mil); or wherein the one or more heating elements have a diameter less than 250 μm (10 mil).

Clause 20. The electron source of any clause or example herein, in particular any one of Clauses 1-19, wherein the one or more heating elements have a first diameter proximal to the conductive terminals and a second diameter proximal to the drift isolation member, and the first diameter is less than the second diameter.

Clause 21. The electron source of any clause or example herein, in particular any one of Clauses 1-20, wherein the drift isolation member has a half-cylinder shape, and/or the emitter-cathode is coupled to a flat-surface-side of the half-cylinder shape, and/or the one or more heating elements are coupled to a curved-surface-side of the half-cylinder shape.

Clause 22. The electron source of any clause or example herein, in particular any one of Clauses 1-20, wherein the drift isolation member has a rectangular bar shape, and/or the emitter-cathode is coupled to a one lateral side of the rectangular bar shape, and/or the one or more heating elements are coupled to an opposite lateral side of the rectangular bar shape.

Clause 23. The electron source of any clause or example herein, in particular any one of Clauses 1-20, wherein the drift isolation member has at least two arms separated by a gap, and/or the arms extend from the insulating support member to a joint or strut spaced from the insulating support member along an axial direction of the emitter-cathode, and/or the emitter-cathode is coupled to the drift isolation member at the joint or strut, and/or the one or more heating elements are coupled to the drift isolation member at the arms.

Clause 24. The electron source of any clause or example herein, in particular any one of Clauses 1-23, the emitter-cathode has an axially-extending open gap that extends from one end of the emitter-cathode that is proximal to the drift isolation member to an intermediate location spaced from a tip of the emitter-cathode.

Clause 25. An electron source, comprising:
an insulating base;
a pair of conductive terminals exposed from a first surface of the insulating base;
an insulating support member extending from the first surface of the insulating base;
an emitter-cathode coupled to the insulating support member; and
one or more heating elements extending between and coupled to the conductive terminals and the emitter-cathode,
wherein the one or more heating elements are coupled to the emitter-cathode at one or more respective first locations that are substantially adjacent to a junction between the emitter-cathode and the insulating support member.

Clause 26. The electron source of any clause or example herein, in particular Clause 25, wherein the emitter-cathode has a first diameter at the first locations, the emitter-cathode has a second diameter remote from the first locations and remote from a tip of the emitter-cathode, and the first diameter is greater than the second diameter.

Clause 27. The electron source of any clause or example herein, in particular Clause 26, wherein the first diameter is at least two times greater than the second diameter.

Clause 28. The electron source of any clause or example herein, in particular any one of Clauses 25-27, wherein the insulating base is formed of a first ceramic, and/or the insulating support member is formed of a second ceramic.

Clause 29. The electron source of any clause or example herein, in particular any one of Clauses 25-28, wherein one or both of the first ceramic and the second ceramic comprise aluminum oxide ($Al_2O_3$) or mullite ($3Al_2O_3.2SiO_2$ or $2Al_2O_3.SiO_2$).

Clause 30. The electron source of any clause or example herein, in particular any one of Clauses 25-29, wherein:
the insulating support member comprises a ceramic rod, and the emitter-cathode is coupled to an axial end surface of the ceramic rod, or
the insulating support member comprises a ceramic tube, and at least a portion of the emitter-cathode is disposed within the ceramic tube and coupled to an inner circumferential surface thereof.

Clause 31. The electron source of any clause or example herein, in particular any one of Clauses 25-30, wherein the heating element comprises a metal having an electrical resistivity of greater than 100 nΩ·m and/or a modulus of elasticity less than 200 GPa; or wherein the heating element comprises a metal having an electrical resistivity of greater than 50 nΩ·m and/or a modulus of elasticity less than 400 GPa.

Clause 32. The electron source of any clause or example herein, in particular any one of Clauses 25-31, wherein the heating element comprises tantalum (Ta) and/or alloys thereof, and/or the emitter-cathode comprises tungsten (W) and/or alloys thereof.

Clause 33. The electron source of any clause or example herein, in particular any one of Clauses 25-32, wherein the emitter-cathode is constructed as a Schottky emitter with a reservoir, and the reservoir is disposed along an axial direction of the emitter-cathode closer to a tip of the emitter-cathode than to the one or more first locations.

Clause 34. The electron source of any clause or example herein, in particular Clause 33, wherein the reservoir comprises a coating of zirconium oxide ($ZrO_2$).

Clause 35. The electron source of any clause or example herein, in particular any one of Clauses 25-32, wherein the emitter-cathode is constructed as a cold field emitter without a reservoir.

Clause 36. The electron source of any clause or example herein, in particular any one of Clauses 25-35, wherein the one or more heating elements have a diameter less than 127 μm (5 mil); or wherein the one or more heating elements have a diameter less than 250 μm (10 mil).

Clause 37. The electron source of any clause or example herein, in particular any one of Clauses 25-36, wherein the one or more heating elements have a first diameter proximal to the conductive terminals and a second diameter proximal to the one or more first locations, and the first diameter is less than the second diameter.

Clause 38. An electron source, comprising:
an insulating base;
a pair of conductive terminals;
an emitter-cathode;
one or more heating elements coupled to at least the conductive terminals; and
means for isolating the emitter-cathode from mechanical drift.

Clause 39. The electron source of any clause or example herein, in particular Clause 38, wherein the insulating base comprises a ceramic.

Clause 40. The electron source of any clause or example herein, in particular Clause 39, wherein the ceramic comprises aluminum oxide ($Al_2O_3$) or mullite ($3Al_2O_3.2SiO_2$ or $2Al_2O_3.SiO_2$).

Clause 41. The electron source of any clause or example herein, in particular any one of Clauses 38-40, wherein the heating element comprises a metal having an electrical resistivity of greater than 100 nΩ·m and/or a modulus of elasticity less than 200 GPa; or wherein the heating element comprises a metal having an electrical resistivity of greater than 50 nΩ·m and/or a modulus of elasticity less than 400 GPa.

Clause 42. The electron source of any clause or example herein, in particular any one of Clauses 38-41, wherein the heating element comprises tantalum (Ta) and/or alloys thereof, and/or the emitter-cathode comprises tungsten (W) and/or alloys thereof.

Clause 43. The electron source of any clause or example herein, in particular any one of Clauses 38-42, wherein the emitter-cathode is constructed as a Schottky emitter with a reservoir.

Clause 44. The electron source of any clause or example herein, in particular Clause 43, wherein the reservoir comprises a coating of zirconium oxide ($ZrO_2$).

Clause 45. The electron source of any clause or example herein, in particular any one of Clauses 38-42, wherein the emitter-cathode is constructed as a cold field emitter without a reservoir.

Clause 46. The electron source of any clause or example herein, in particular any one of Clauses 38-45, wherein the one or more heating elements have a diameter less than 127

μm (5 mil); or wherein the one or more heating elements have a diameter less than 250 μm (10 mil).

Clause 47. The electron source of any clause or example herein, in particular any one of Clauses 38-46, wherein the one or more heating elements have a first diameter proximal to the conductive terminals and a second diameter proximal to the one or more first locations, and the first diameter is less than the second diameter.

Clause 48. A method of manufacturing an electron source, the method comprising:
coupling an insulating support member to an insulating base having a plurality of conducive terminals;
coupling a drift isolation member to the insulating support member;
coupling an emitter to the drift isolation member;
coupling one or more heating elements to conductive terminals;
coupling the one or more heating elements to the drift isolation member; and
forming an emitter tip at an end of the emitter to form an emitter-cathode.

Clause 49. The method of any clause or example herein, in particular Clause 48, wherein the method forms an electron source according to any of Clauses 1-24 and 38-47.

Clause 50. A method of manufacturing an electron source, the method comprising:
coupling an insulating support member to an insulating base having a plurality of conducive terminals;
coupling an emitter to the insulating support member;
coupling one or more heating elements to conductive terminals;
coupling the one or more heating elements to the emitter at one or more first locations that are substantially adjacent to a junction between the emitter and the insulating support member; and
forming an emitter tip at an end of the emitter to form an emitter-cathode.

Clause 51. The method of any clause or example herein, in particular Clause 50, wherein the method forms an electron source according to any of Clauses 25-47.

Clause 52. The method of any clause or example herein, in particular any one of Clauses 48-51, further comprising modifying the one or more heating elements to have a variable diameter along a length thereof.

Clause 53. The method of any clause or example herein, in particular any one of Clauses 48-52, wherein the forming an emitter tip comprises etching the emitter.

Clause 54. The method of any clause or example herein, in particular any one of Clauses 48-53, wherein the coupling the insulating support member to the insulating base comprises sintering, and/or the coupling the drift isolation member to the insulating support member comprises brazing, and/or the coupling the emitter to the drift isolation member comprises welding, and/or the coupling the one or more heating elements to the conductive terminals comprises welding, and/or the coupling the one or more heating elements to the drift isolation member comprises welding, and/or the coupling the emitter to the insulating support member comprises brazing, and/or the coupling the one or more heating elements to the emitter comprises welding.

Clause 55. The method of any clause or example herein, in particular any one of Clauses 48-54, wherein the insulating support member is directly coupled (e.g., without a separate intervening member) to the insulating base, and/or the drift isolation member is directly coupled (e.g., without a separate intervening member) to the insulating support member, and/or the emitter is directly coupled (e.g., without a separate intervening member) to the drift isolation member, and/or the one or more heating elements are directly coupled (e.g., without a separate intervening member) to the drift isolation member, and/or the emitter is directly coupled (e.g., without a separate intervening member) to the insulating support member, and/or the one or more heating elements are directly coupled (e.g., without a separate intervening member) to the emitter.

CONCLUSION

Any of the features illustrated or described with respect to FIGS. 2A-13B and Clauses 1-55 can be combined with any other of FIGS. 2A-13B and Clauses 1-55 to provide systems, methods, devices, and embodiments not otherwise illustrated or specifically described herein. For example, the split filament structure of emitter-cathode 810 in FIGS. 8A-8C can be substituted for emitter-cathode 310 in any of FIGS. 2A-7C and 11A-13B. Other combinations and variations are also possible according to one or more contemplated embodiments.

In view of the many possible embodiments to which the principles of the disclosed technology may be applied, it should be recognized that the illustrated embodiments are only preferred examples and should not be taken as limiting the scope of the disclosed technology. Rather, the scope is defined by the following claims. We therefore claim all that comes within the scope of these claims.

The invention claimed is:

1. An electron source, comprising:
an insulating base;
a pair of conductive terminals exposed from a first surface of the insulating base;
an insulating support member extending from the first surface of the insulating base;
a drift isolation member disposed at an end of the insulating support member remote from the insulating base;
an emitter-cathode coupled to the drift isolation member; and
one or more heating elements coupled to the conductive terminals and the drift isolation member.

2. The electron source of claim 1, wherein:
the insulating base is formed of a first ceramic;
the insulating support member is formed of a second ceramic; and
one or both of the first ceramic and the second ceramic comprise aluminum oxide ($Al_2O_3$) or mullite ($3Al_2O_3.2SiO_2$ or $2Al_2O_3.SiO_2$).

3. The electron source of claim 1, wherein:
the insulating support member comprises a ceramic rod, and the drift isolation member is coupled to an axial end surface of the ceramic rod; or
the insulating support member comprises a ceramic tube, and at least a portion of the drift isolation member is disposed within the ceramic tube and coupled to an inner circumferential surface thereof.

4. The electron source of claim 1, wherein:
the emitter-cathode is welded to a first side of the drift isolation member, and
the one or more heating elements are welded to a second side of the drift isolation member opposite to the first side.

5. The electron source of claim 1, wherein:
the one or more heating elements are welded to the drift isolation member at one or more respective first locations, the emitter-cathode is welded to the drift isolation member at a second location, and the one or more first locations are closer to the insulating support member than the second location along an axial direction of the emitter-cathode.

6. The electron source of claim 5, wherein the first locations are adjacent to a junction between the drift isolation member and the insulating support member.

7. The electron source of claim 1, wherein the drift isolation member comprises a first metal, the heating element comprises a second metal, and the emitter-cathode comprises a third metal.

8. The electron source of claim 7, wherein the drift isolation member comprises a ceramic member coated with the first metal.

9. The electron source of claim 7, wherein:
the first metal has a modulus of elasticity that is greater than that of the second metal;
the second metal has an electrical resistivity of greater than 50 nΩ·m and a modulus of elasticity less than 400 GPa;
the first metal has a modulus of elasticity of at least 400 GPa; or
any combination of the foregoing.

10. The electron source of claim 7, wherein the first metal is rhenium (Re) or alloys thereof, the second metal is tantalum (Ta) or alloys thereof, the third metal is tungsten (W) or alloys thereof, or any combination of the foregoing.

11. The electron source of claim 1, wherein the drift isolation member has a maximum lateral dimension in plane perpendicular to a direction of extension of the emitter-cathode, and the maximum lateral dimension is at least two times greater than a maximum diameter of the emitter-cathode.

12. The electron source of claim 1, wherein:
the emitter-cathode is constructed as a Schottky emitter with a reservoir, and the reservoir is disposed along an axial direction of the emitter-cathode closer to a tip of the emitter-cathode than to the drift isolation member; or
the emitter-cathode is constructed as a cold field emitter without a reservoir.

13. The electron source of claim 1, wherein the one or more heating elements have a diameter less than 250 μm (10 mil).

14. The electron source of claim 1, wherein the one or more heating elements have a first diameter proximal to the conductive terminals and a second diameter proximal to the drift isolation member, and the first diameter is less than the second diameter.

15. The electron source of claim 1, wherein the drift isolation member has a half-cylinder shape, the emitter-cathode is coupled to a flat-surface-side of the half-cylinder shape, and the one or more heating elements are coupled to a curved-surface-side of the half-cylinder shape.

16. The electron source of claim 1, wherein the drift isolation member has a rectangular bar shape, the emitter-cathode is coupled to a one lateral side of the rectangular bar shape, and the one or more heating elements are coupled to an opposite lateral side of the rectangular bar shape.

17. The electron source of claim 1, wherein the drift isolation member has at least two arms separated by a gap, the arms extend from the insulating support member to a joint or strut spaced from the insulating support member along an axial direction of the emitter-cathode, the emitter-cathode is coupled to the drift isolation member at the joint or strut, and the one or more heating elements are coupled to the drift isolation member at the arms.

18. An electron source, comprising:
an insulating base;
a pair of conductive terminals exposed from a first surface of the insulating base;
an insulating support member extending from the first surface of the insulating base;
an emitter-cathode coupled to the insulating support member; and
one or more heating elements extending between and coupled to the conductive terminals and the emitter-cathode,
wherein the one or more heating elements are coupled to the emitter-cathode at one or more respective first locations that are substantially adjacent to a junction between the emitter-cathode and the insulating support member.

19. The electron source of claim 18, wherein the emitter-cathode has a first diameter at the first locations and a second diameter remote from the first locations, and the first diameter is greater than the second diameter.

20. The electron source of claim 19, wherein the first diameter is at least two times greater than the second diameter.

21. The electron source of claim 18, wherein:
the insulating base is formed of a first ceramic;
the insulating support member is formed of a second ceramic; and
one or both of the first ceramic and the second ceramic comprise aluminum oxide ($Al_2O_3$) or mullite ($3Al_2O_3 \cdot 2SiO_2$ or $2Al_2O_3 \cdot SiO_2$).

22. The electron source of claim 18, wherein:
the insulating support member comprises a ceramic rod, and the emitter-cathode is coupled to an axial end surface of the ceramic rod; or
the insulating support member comprises a ceramic tube, and at least a portion of the emitter-cathode is disposed within the ceramic tube and coupled to an inner circumferential surface thereof.

23. The electron source of claim 18, wherein the heating element comprises a metal having an electrical resistivity of greater than 50 nΩ·m and a modulus of elasticity less than 400 GPa.

24. The electron source of claim 18, wherein the heating element comprises tantalum (Ta) or alloys thereof, and the emitter-cathode comprises tungsten (W) or alloys thereof.

25. The electron source of claim 18, wherein:
the emitter-cathode is constructed as a Schottky emitter with a reservoir, and the reservoir is disposed along an axial direction of the emitter-cathode closer to a tip of the emitter-cathode than to the one or more first locations; or
the emitter-cathode is constructed as a thermal field or cold field emitter without a reservoir.

26. The electron source of claim 18, wherein the one or more heating elements have a first diameter proximal to the conductive terminals and a second diameter proximal to the one or more first locations, and the first diameter is less than the second diameter.

* * * * *

UNITED STATES PATENT AND TRADEMARK OFFICE
CERTIFICATE OF CORRECTION

PATENT NO. : 11,749,492 B2
APPLICATION NO. : 17/654759
DATED : September 5, 2023
INVENTOR(S) : Kun Liu et al.

It is certified that error appears in the above-identified patent and that said Letters Patent is hereby corrected as shown below:

In the Specification

In Column 8, Line 8, delete "($3Al_2O_3.2SiO_2$ or $2Al_2O_3.SiO_2$)" and insert -- ($3Al_2O_3 \cdot 2SiO_2$ or $2Al_2O_3 \cdot SiO_2$) --, therefor.

In Column 19, Line 27, delete "($3Al_2O_3.2SiO_2$ or $2Al_2O_3.SiO_2$)" and insert -- ($3Al_2O_3 \cdot 2SiO_2$ or $2Al_2O_3 \cdot SiO_2$) --, therefor.

In Column 21, Line 44, delete "$3Al_2O_3.2SiO_2$" and insert -- $3Al_2O_3 \cdot 2SiO_2$ --, therefor.

In Column 21, Line 45, delete "$2Al_2O_3.SiO_2$" and insert -- $2Al_2O_3 \cdot SiO_2$ --, therefor.

In Column 22, Line 39, delete "$3Al_2O_3.2SiO_2$" and insert -- $3Al_2O_3 \cdot 2SiO_2$ --, therefor.

In Column 22, Line 40, delete "$2Al_2O_3.SiO_2$" and insert -- $2Al_2O_3 \cdot SiO_2$ --, therefor.

In Column 24, Claim 2, Line 49, delete "($3Al_2O_3.2SiO_2$ or $2Al_2O_3.SiO_2$)." and insert -- ($3Al_2O_3 \cdot 2SiO_2$ or $2Al_2O_3 \cdot SiO_2$). --, therefor.

In Column 26, Claim 21, Line 34, delete "($3Al_2O_3.2SiO_2$ or $2Al_2O_3.SiO_2$)." and insert -- ($3Al_2O_3 \cdot 2SiO_2$ or $2Al_2O_3 \cdot SiO_2$). --, therefor.

Signed and Sealed this
Thirty-first Day of October, 2023

Katherine Kelly Vidal
*Director of the United States Patent and Trademark Office*